(12) United States Patent
Kim et al.

(10) Patent No.: US 12,068,178 B2
(45) Date of Patent: Aug. 20, 2024

(54) CHIP TRANSFER APPARATUS

(71) Applicant: SAMSUNG ELECTRONICS CO., LTD., Suwon-si (KR)

(72) Inventors: Dongkyun Kim, Suwon-si (KR); Hyunjoon Kim, Seoul (KR); Joonyong Park, Suwon-si (KR); Seogwoo Hong, Yongin-si (KR); Kyungwook Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 211 days.

(21) Appl. No.: 17/736,352

(22) Filed: May 4, 2022

(65) Prior Publication Data

US 2023/0154769 A1    May 18, 2023

(30) Foreign Application Priority Data

Nov. 16, 2021    (KR) .................. 10-2021-0158049

(51) Int. Cl.
   *H01L 21/67*     (2006.01)
   *B65G 51/02*     (2006.01)
   *H01L 21/673*    (2006.01)

(52) U.S. Cl.
   CPC ........ *H01L 21/67121* (2013.01); *B65G 51/02* (2013.01); *H01L 21/67333* (2013.01)

(58) Field of Classification Search
   CPC ............... H01L 21/67333; H01L 21/67121
   USPC ............................................ 209/155
   See application file for complete search history.

(56) References Cited

U.S. PATENT DOCUMENTS

| | | |
|---|---|---|
| 6,555,408 B1 | 4/2003 | Jacobsen et al. |
| 7,531,218 B2 | 5/2009 | Smith et al. |
| 7,943,052 B2 | 5/2011 | Wu et al. |
| 9,240,145 B2 | 1/2016 | Ichioka et al. |
| 10,082,455 B2 | 9/2018 | Shin et al. |
| 10,115,862 B2 | 10/2018 | Zhan et al. |
| 10,211,364 B2 | 2/2019 | Schuele et al. |
| 10,243,097 B2 | 3/2019 | Yuen |
| 10,418,527 B2 | 9/2019 | Sasaki et al. |

(Continued)

FOREIGN PATENT DOCUMENTS

| | | | | |
|---|---|---|---|---|
| CN | 117352601 A | * | 4/2023 | |
| CN | 117352601 A | * | 1/2024 | ....... H01L 21/67132 |

(Continued)

OTHER PUBLICATIONS

The Extended European Search Report issued on May 25, 2023 by the European Patent Office for European Patent Application No. 22174218.2.

(Continued)

*Primary Examiner* — Terrell H Matthews
(74) *Attorney, Agent, or Firm* — Sughrue Mion, PLLC

(57) ABSTRACT

A chip transfer apparatus includes: a chip storage module in which a plurality of micro-semiconductor chips and a suspension including impurities are stored; a chip filtration module separating a first suspension including the plurality of micro-semiconductor chips and a second suspension including the impurities in the suspension; and a chip supply module configured to supply the first suspension onto the transfer substrate such that the first suspension is introduced from the chip filtration module and the plurality of micro-semiconductor chips are flowable on the transfer substrate.

24 Claims, 24 Drawing Sheets

(56) References Cited

U.S. PATENT DOCUMENTS

| | | |
|---|---|---|
| 10,930,819 B2 | 2/2021 | Sasaki et al. |
| 11,296,059 B2 * | 4/2022 | Sasaki .................. H01L 23/544 |
| 2006/0269689 A1 | 11/2006 | Craig et al. |
| 2020/0152826 A1 | 5/2020 | Lee et al. |
| 2020/0279835 A1 | 9/2020 | Sasaki et al. |
| 2020/0286870 A1 | 9/2020 | Sasaki et al. |
| 2021/0091257 A1 | 3/2021 | Hwang et al. |
| 2021/0119079 A1 | 4/2021 | Hwang et al. |
| 2021/0397045 A1 | 12/2021 | Hwang et al. |
| 2022/0013400 A1 | 1/2022 | Hwang et al. |
| 2022/0029046 A1 | 1/2022 | Hong et al. |
| 2022/0102602 A1 | 3/2022 | Hwang et al. |
| 2022/0189810 A1 | 6/2022 | Hwang et al. |
| 2022/0246448 A1 | 8/2022 | Park et al. |
| 2022/0310883 A1 | 9/2022 | Takeya |

FOREIGN PATENT DOCUMENTS

| | | | |
|---|---|---|---|
| EP | 4180124 A2 * | 5/2023 | ............. B65G 51/02 |
| JP | 2021-71595 A | 5/2021 | |
| KR | 101356933 B1 | 1/2014 | |
| KR | 20230071637 A * | 11/2021 | |

OTHER PUBLICATIONS

Partial European Search Report dated Jan. 27, 2023, issued by European Patent Office for European Application No. 22174218.2.
Sajeesh et al., "Particle separation and sorting in microfluidic devices: a review", Springer; Microfluids and Nanofluidics, vol. 17, No. 1 published Nov. 29, 13, 52 pages, XP055342704.

* cited by examiner

CHIP TRANSFER APPARATUS

CROSS-REFERENCE TO RELATED APPLICATION

This application is based on and claims priority under 35 U.S.C. § 119 to Korean Patent Application No. 10-2021-0158049, filed on Nov. 16, 2021, in the Korean Intellectual Property Office, the disclosure of which is incorporated by reference herein in its entirety.

BACKGROUND

1. Field

The disclosure relates to a chip transfer apparatus.

2. Description of the Related Art

A micro-semiconductor chip, for example, a light-emitting diode (LED), has low power consumption and is eco-friendly. Due to these advantages, industrial demand for LEDs is increasing. LEDs are being applied not only for lighting devices or LCD backlights, but also for LED display devices. That is, a display device using a micro-unit LED chip is being developed. In manufacturing a micro LED display device, it is necessary to transfer micro LEDs to a substrate. A pick-and-place method is widely used as a method of transferring micro LEDs. However, with this method, as the size of a micro LED becomes smaller and the size of a display increases, productivity is lowered.

SUMMARY

Provided are apparatuses for transferring a micro-semiconductor chip by a wet method.

Additional aspects will be set forth in part in the description which follows and, in part, will be apparent from the description, or may be learned by practice of the presented example embodiments of the disclosure.

According to an aspect of the disclosure, there is provided a chip transfer apparatus configured to align a plurality of micro-semiconductor chips in a plurality of grooves of a transfer substrate, the chip transfer apparatus including: a chip storage module configured to store a suspension including a plurality of micro-semiconductor chips and impurities; a chip filtration module configured to receive the suspension from the chip storage module and separate a first suspension including the plurality of micro-semiconductor chips and a second suspension including the impurities; and a chip supply module configured to supply the first suspension onto the transfer substrate from the chip filtration module, wherein the plurality of micro-semiconductor chips included in the first suspension are flowable on the transfer substrate.

The chip filtration module may be further configured to separate the suspension into the first suspension and the second suspension using at least one of sonophoretic dynamics, dielectrophoresis, magnetophoretic dynamics, microfluidic dynamics, centrifugal force, or pinched flow fractionation.

At least one of a size and a mass of the impurities may be different from a size or a mass of the micro-semiconductor chips included in the first suspension.

The impurities may include a micro-semiconductor chip debris having at least one of a size and a mass different from a size or a mass of the micro-semiconductor chips included in the first suspension.

A micro-semiconductor chip debris included in the second suspension may be smaller than the micro-semiconductor chips included in the first suspension.

The micro-semiconductor chip debris included in the second suspension may be a partially broken micro-semiconductor chip.

The chip filtration module may include an inlet connected to a lower area of the chip storage module, the inlet configured to receive the suspension is introduced from the chip storage module; a channel connected to the inlet and through which the suspension flows; and a first outlet connected to the channel and an upper area of the chip supply module and configured to discharge the first suspension to the chip supply module.

The chip filtration module may be formed of a substrate including at least one of silicon, glass, polymer, plastic, or metal, and wherein the channel is embedded in the substrate.

An anti-adhesive film may be formed on a surface of the channel, the anti-adhesive film configured to prevent adherence of the micro-semiconductor chips.

The anti-adhesive film may be hydrophobic.

The chip transfer apparatus may further include a second outlet connected to the channel and configured to discharge the second suspension.

The channel may include: a branching area in which the micro-semiconductor chips and the impurities are separated; a first channel through which the suspension flows, the first channel connecting the inlet to the branching area; a second channel through which the first suspension flows, the second channel connecting the branching area to the first outlet; and a third channel through which the second suspension flows, the third channel connecting the branching area to the second outlet.

A dimension of the third channel may be smaller than a dimension of the second channel.

The third channel may include a first sub-channel and a second sub-channel spaced apart the first sub-channel, and wherein the second channel is provided between the first sub-channel and the second sub-channel.

The first sub-channel and the second sub-channel may have a symmetrical structure with respect to the second channel.

The chip filtration module may further include a second outlet connected to the channel and configured to discharge a first sub-suspension including impurities smaller than the micro-semiconductor chips in the second suspension; and a third outlet connected to the channel and configured to discharge a second sub-suspension including impurities larger than the micro-semiconductor chips in the second suspension.

The channel may include a first branching area and a second branching area spaced apart from the first branching area; a first channel through which the suspension flows, the first channel connecting the inlet to the first branching area; a second channel through which the first suspension and the second sub-suspension flow, the second channel connecting the first branching area to the first branching area; a third channel through which the first sub-suspension flows, the third channel connecting the first branching area to the second outlet; a fourth channel through which the first suspension flows, the fourth channel connecting the second branching area to the first outlet; and a fifth channel through which the second sub-suspension flows, the fifth channel connecting the second branching area to the third outlet.

The first channel, the second channel, and the fifth channel may have a same length direction.

The chip storage module may include: a stirrer configured to mix the suspension to make a concentration of the micro-semiconductor chips uniform.

The micro-semiconductor chips may be light-emitting devices.

The light-emitting devices each may include first and second electrodes apart from each other on one surface.

According to another aspect of the disclosure, there is provided a chip filtration apparatus including: an inlet configured to receive a first suspension including a plurality of micro-semiconductor chips and a plurality of impurities; a first channel configured to transport the first suspension from the inlet to a junction at which the first suspension is separated into a second suspension including the plurality of micro-semiconductor chips and a third suspension including the plurality of impurities; a second channel connected to the junction and configured to transport the second suspension including the plurality of micro-semiconductor chips; a third channel connected to the junction and configured to transport the third suspension including the plurality of impurities; a first outlet connected to the second channel and configured to receive the second suspension including the plurality of micro-semiconductor chips; and a second outlet connected to the third channel and configured to receive the third suspension including the plurality of impurities.

The inlet may be connected to a lower area of a chip storage module.

The first outlet may be connected to an upper area of a chip supply module and configured to discharge the second suspension to the chip supply module.

The first suspension may be separated into the second suspension and the third suspension using at least one of sonophoretic dynamics, dielectrophoresis, magnetophoretic dynamics, microfluidic dynamics, centrifugal force, or pinched flow fractionation.

BRIEF DESCRIPTION OF THE DRAWINGS

The above and other aspects, features, and advantages of certain example embodiments of the disclosure will be more apparent from the following description taken in conjunction with the accompanying drawings, in which:

FIGS. 37 to 40 are views for explaining an operation of an antistatic module according to an example embodiment.

DETAILED DESCRIPTION

Figure 1:
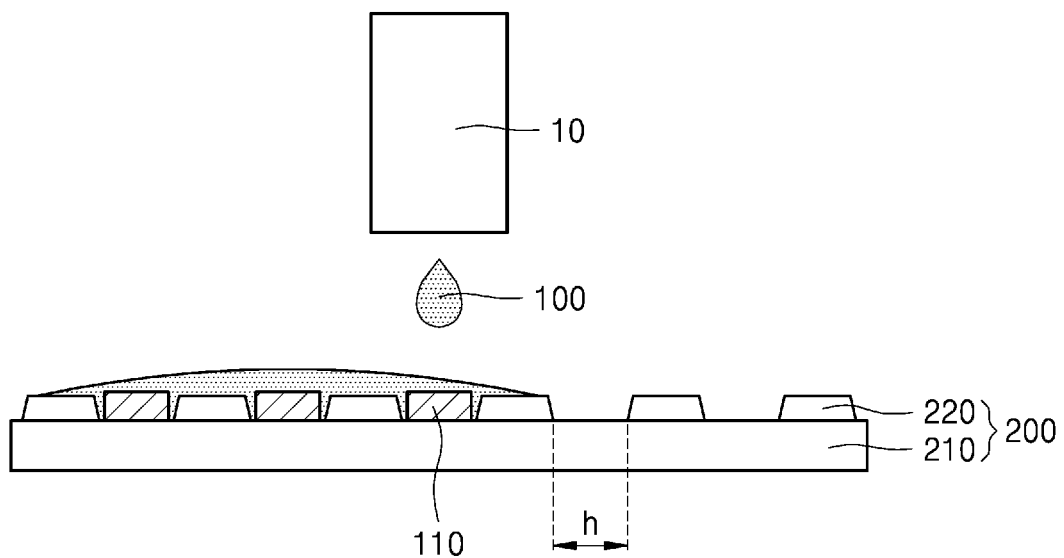
FIG. 1 is a view schematically illustrating a method of transferring a micro-semiconductor chip to a transfer substrate, according to an example embodiment.

Reference will now be made in detail to example embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a chip transfer apparatus according to various example embodiments will be described in detail with reference to the accompanying drawings. The same reference numerals refer to the same elements throughout. In the drawings, the sizes of constituent elements may be exaggerated for clarity. Though terms like 'first' and 'second' are used to describe various elements, the elements are not limited to these terms. These terms are used only to differentiate an element from another element.

As used herein, the singular forms "a," "an," and "the" are intended to include the plural forms as well, unless the context clearly indicates otherwise. In addition, it will be understood that when a unit is referred to as "comprising" another element, it does not preclude the possibility that one or more other elements may exist or may be added. In addition, thicknesses or sizes of elements in the drawings are exaggerated for convenience and clarity of description. Furthermore, when an element is referred to as being "on" or "above" another element, it may be directly on the other element, or intervening elements may also be present. Moreover, the materials constituting each layer in the following example embodiments are merely examples, and other materials may be used.

In addition, the terms "-er", "-or", and "module" described in the specification mean units for processing at least one function and/or operation and can be implemented by hardware components or software components and combinations thereof.

The particular implementations shown and described herein are illustrative examples of the disclosure and are not intended to otherwise limit the scope of the disclosure in any way. For the sake of brevity, conventional electronics, control systems, software development and other functional aspects of the systems may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device.

The use of the terms "a," "an," and "the" and similar referents is to be construed to cover both the singular and the plural.

Figure 2:
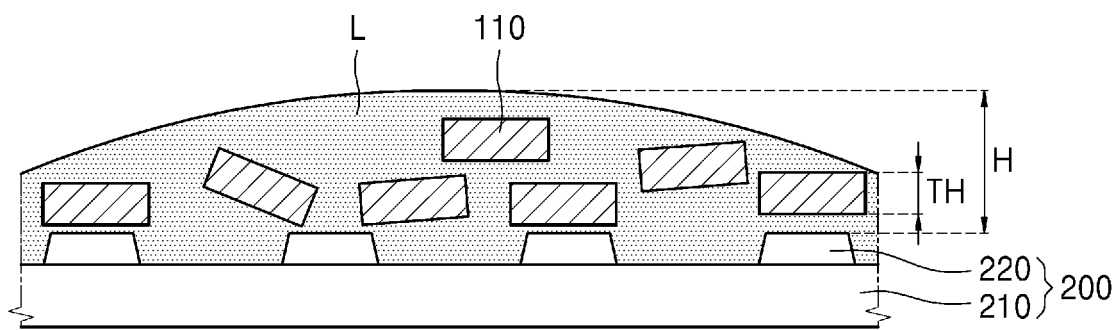
FIG. 2 is a view for explaining a state in which a suspension is supplied onto a transfer substrate according to an example embodiment.

FIG. 1 is a view schematically showing a method of transferring a micro-semiconductor chip 110 to a transfer substrate 200 according to an example embodiment, and FIG. 2 is a view for explaining a state in which a suspension 100 is supplied onto the transfer substrate 200 according to an example embodiment.

The transfer substrate 200 may include a plurality of grooves h into which at least a portion of the micro-semiconductor chip 110 may be provided. According to an example embodiment, at least a portion of the micro-semiconductor chip 110 may be inserted or placed into a groove, among the plurality of grooves. Each of the plurality of grooves h may have a size into which at least a portion of the micro-semiconductor chip 110 may be provided. For example, a size of a groove h may have a size of a micro unit. For example, the size of the groove h may be less than 1000 μm, for example, 500 μm or less, 200 μm or less, or 100 μm or less. The size of the groove h may be greater than that of the micro-semiconductor chip 110.

Intervals between the plurality of grooves h may correspond to intervals between micro-semiconductor chips 110 inserted or placed into the grooves h. For example, when the micro-semiconductor chip 110 is a light-emitting device, intervals between the plurality of grooves h may correspond to a pixel interval of a display device used in a final product. However, the spacing between the plurality of grooves h is not limited thereto, and may be variously modified as necessary.

The transfer substrate 200 may include a plurality of layers. For example, the transfer substrate 200 may include a base substrate 210 and guide barrier ribs 220. According to an example embodiment, the base substrate 210 and the guide barrier ribs 220 may be made of different materials. However, the disclosure is not limited thereto, and as such, according to another example embodiment, the base substrate 210 and the guide barrier ribs 220 may be made of the same material. However, the configuration of the transfer substrate 200 is not limited to a plurality of layers, and may be a single-layer transfer substrate 200. In addition, a planar shape of the transfer substrate 200 may be a quadrangle, but is not limited thereto. For example, the planar shape of the transfer substrate 200 may be circular.

A chip transfer module 10 may supply the suspension 100 including the plurality of micro-semiconductor chips 110 and a liquid L to the transfer substrate 200 so that the plurality of micro-semiconductor chips 110 are flowable on the transfer substrate 200.

As shown in FIG. 2, When the suspension 100 is supplied to the transfer substrate 200, the liquid L contained in the suspension 100 forms a thin film on the transfer substrate 200, and at least some of the plurality of micro-semiconductor chips 110 may be in a state immersed in the liquid L.

According to an example embodiment, because the plurality of micro-semiconductor chips 110 are immersed in the liquid L, they may be flowable on the transfer substrate 200. At this time, the liquid L supplied onto the transfer substrate 200 allows the plurality of micro-semiconductor chips 110 to flow, but may be thinly formed on the transfer substrate 200 to prevent or minimize an unintended flow by a chip alignment module 20 to be described later.

For example, the liquid L may be maintained on the transfer substrate 200 without a separate configuration (e.g., a water tank, etc.) for maintaining the liquid L on the transfer substrate 200. The liquid L supplied onto the transfer substrate 200 may have a surface convex upward due to surface tension or the like. A height H of the liquid L may decrease as the liquid L approaches an edge of the transfer substrate 200. The height H of the liquid L supplied onto the transfer substrate 200 may be less than or equal to 20 times a thickness TH of the micro-semiconductor chip 110. According to an example embodiment, the height H of the liquid L supplied onto the transfer substrate 200 may be less than or equal to 10 times the thickness TH of the micro-semiconductor chip 110. However, the disclosure is not limited thereto, and as such, according to an example embodiment, the height H of the liquid L supplied onto the transfer substrate 200 may be less than or equal to 5 times the thickness TH of the micro-semiconductor chip 110. According to an example embodiment, the height H of the liquid L supplied onto the transfer substrate 200 may be less than or equal to twice the thickness TH of the micro-semiconductor chip 110. The height H of the liquid L may be an average height.

The liquid L may be any type of liquid as long as it does not corrode or damage the micro-semiconductor chip 110. The liquid L may include, for example, at least one of water, ethanol, alcohol, polyol, ketone, halocarbon, acetone, a flux, or an organic solvent. The organic solvent may include, for example, isopropyl alcohol (IPA). The liquid L is not limited thereto, and various changes are possible.

The micro-semiconductor chip 110 may be a member having a size of a micro unit. For example, a width, diameter, or thickness of the micro-semiconductor chip 110 may be about 1000 µm or less, or 200 µm or less, or 100 µm or less, or 50 µm or less. The width, diameter, or thickness of the micro-semiconductor chip 110 may be about 1 µm or more.

The micro-semiconductor chip 110 may be a micro light-emitting device. However, the micro-semiconductor chip 110 is not limited thereto, and may be a member having a size of a micro unit. For example, the micro-semiconductor chip 110 may be a pressure sensor, a photodiode, a thermistor, a piezoelectric element, or the like.

The micro-semiconductor chip 110 may have a symmetrical planar shape. For example, the planar shape of the micro-semiconductor chip 110 may be a square, a circle, a triangle, or a cube.

Figure 3:
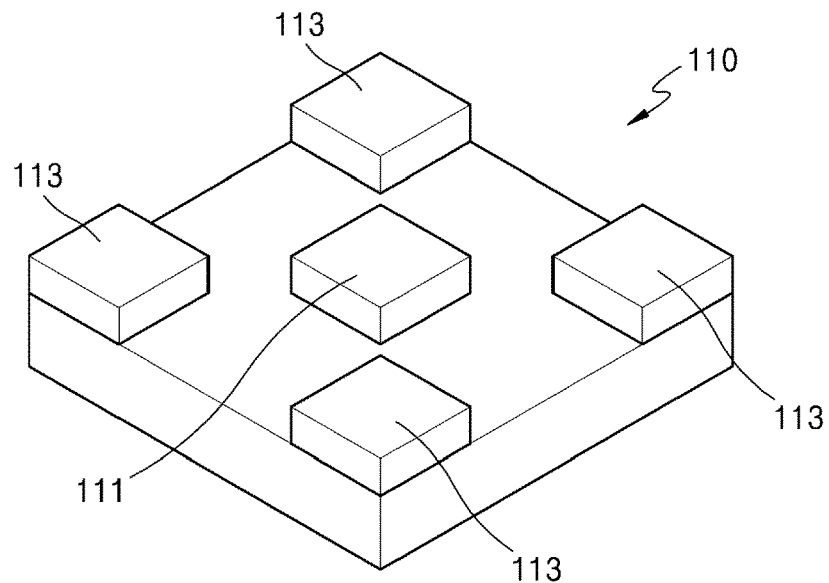
FIG. 3 is a view of a micro-semiconductor chip according to an example embodiment.

FIG. 3 is a view of the micro-semiconductor chip 110 according to an example embodiment. Referring to FIG. 3, an electrode 111 may be arranged at one of the surfaces of the micro-semiconductor chip 110. The electrode of the micro-semiconductor chip 110 may have a symmetrical structure. For example, a first electrode 111 of the micro-semiconductor chip 110 may be arranged in the center of the micro-semiconductor chip 110, and the second electrode 113 may be apart from the first electrode 111 and arranged at the periphery of the of the micro-semiconductor chip 110. As such, even if the micro-semiconductor chip 110 rotates while the micro-semiconductor chip 110 is aligned with the groove h in a later operation, the electrodes of the micro-semiconductor chip 110 may be arranged at a certain position.

The chip transfer module 10 may simultaneously supply the liquid L and the micro-semiconductor chip 110 in the form of the suspension 100.

Figure 4:
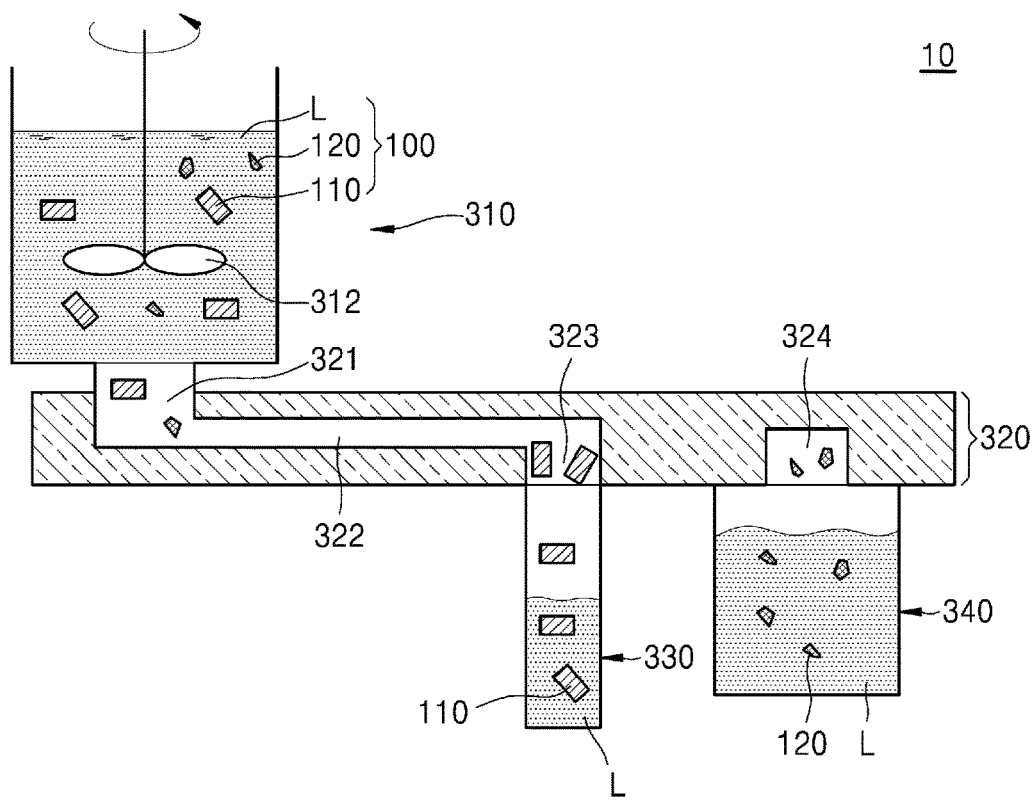
FIG. 4 is a schematic view of a chip transfer module according to an example embodiment.

FIG. 4 is a view schematically illustrating a chip transfer module 10 according to an example embodiment. Referring to FIG. 4, the chip transfer module 10 may include a chip storage module 310 in which the suspension 100 may be stored. According to an example embodiment, the suspension 100 includes a mixture of the plurality of micro-semiconductor chips 110 and the liquid L. That is, the chip storage module 310 includes the suspension 100 in which the plurality of micro-semiconductor chips 110 and the liquid L are mixed.

In the suspension 100 stored in the chip storage module 310, the plurality of micro-semiconductor chips 110 have a greater specific gravity (or relative density) than that of the liquid L. The specific gravity (or the relative density) of the micro-semiconductor chip 110 may be 2 times or more of the specific gravity (or relative density) of the liquid L. However, the disclosure is not limited thereto, and as such, the specific gravity of the micro-semiconductor chip 110 may be, for example, 4 times or more, or for example, 6 times or more of the specific gravity (or the relative density) of the liquid L. The specific gravity (or the relative density) of the micro-semiconductor chip 110 may be 40 times or less of the specific gravity (or the relative density) of the liquid L.

As such, when the specific gravity (or the relative density) of the micro-semiconductor chip 110 is greater than the specific gravity (or the relative density) of the liquid L, the plurality of micro-semiconductor chips 110 may be in a sinking state before being discharged from the chip storage module 310. For example, the plurality of micro-semiconductor chips 110 may be clustered in a lower area of the chip storage module 310. In this state, when the suspension 100 is discharged from the chip storage module 310, a discharge amount of the micro-semiconductor chip 110 may not be constant. In particular, if there is an outlet in the lower area of the chip storage module 310, a large amount of the micro-semiconductor chip 110 may be unintentionally discharged at once.

To prevent this from happening, the chip storage module 310 may be configured such that the plurality of micro-semiconductor chips 110 included in the suspension 100 are evenly mixed.

For example, the chip storage module 310 may include a stirrer 312 arranged inside the suspension 100 to mix the suspension 100. The stirrer 312 may be configured not to damage the micro-semiconductor chip 110 despite collision with the micro-semiconductor chip 110. For example, the stirrer 312 may have less strength than the micro-semiconductor chip 110, or may have a greater elastic deformation force. As another example, the micro-semiconductor chip 110 may be mixed by applying vibration to the chip storage module 310 or rotating the chip storage module 310.

In the suspension 100 included in the chip storage module 310, an impurity 120 other than the micro-semiconductor chip 110 may be further present. For example, after growing and separating the micro-semiconductor chip 110 on a silicon or sapphire substrate, in a process of placing the separated micro-semiconductor chip 110 in the liquid L to make the suspension 100, the impurity 120, which is a material other than the micro-semiconductor chip 110, may enter together. As another example, in a process of mixing the suspension 100 to have a uniform concentration, the micro-semiconductor chips 110 collide with the stirrer 312 or the micro-semiconductor chips 110 collide with each other, thereby generating the impurity 120 as fragments. Accordingly, the impurity 120 is a material different from that of the micro-semiconductor chip 110 in at least one of a size and a mass. The impurity 120 may be a material different from that of the micro-semiconductor chip 110, and may be a portion of the micro-semiconductor chip 110, that is, a broken micro-semiconductor chip 110.

As another example, different types of micro-semiconductor chips may be wet-transferred with the same chip transfer module 10. The micro-semiconductor chip used in the previous wetting transfer process may remain in the chip storage module 310, and an unwanted micro-semiconductor chip 110 may be erroneously transferred to the transfer substrate 200. The above-described other types of micro-semiconductor chips may have different sizes, masses, etc. compared to the current micro-semiconductor chip 110 to be transferred, and the previously used micro-semiconductor chips may be the impurity 120 from a viewpoint of the current micro-semiconductor chip 110 to be transferred.

When impurities 120 undesirably included in a suspension storage process, the impurities 120 that may be generated during a stirring process, and impurities that are other micro-semiconductor chips remaining in the previous transfer process are transferred together, a transfer yield of the chip transfer module 10 is lowered.

The chip transfer module 10 according to an example embodiment may further include a chip filtration module 320 that separates the micro-semiconductor chip 110 and the impurity 120 from the suspension 100. In the chip filtration module 320, the suspension 100 is introduced from the chip storage module 310. The chip filtration module 320 may provide only the first suspension to a chip supply module 330 by separating the first suspension including the micro-semiconductor chip 110 and the second suspension including the impurity 120 from the suspension 100. In the chip transfer module 10, the micro-semiconductor chip 110 having certain requirements is supplied to the transfer substrate 200, so that the transfer yield may be increased.

The chip filtration module 320 may include an inlet 321 through which the suspension 100 is introduced from the chip storage module 310, a channel 322 through which the suspension 100 flows, and a first outlet 323 for discharging the first suspension including the microphone semiconductor chip 110 to the chip supply module 330. The chip filtration module 320 may further include a second outlet 324 for discharging the second suspension including the impurity 120.

The inlet 321 may be connected to a lower area of the chip storage module 310, and the first outlet 323 may be connected to an upper area of the chip supply module 330. A difference in pressure allows the suspension 100 to naturally pass through the chip filtration module 320. In addition, the second outlet 324 may be connected to an impurity storage module 340. The second outlet 324 may be connected to an upper area of the impurity storage module 340 so that the second suspension may move naturally by pressure and be stored in the impurity storage module 340.

According to an example embodiment, the sizes of the inlet 321, the channel 322, and the first outlet 323 and the second outlet 324 of the chip filtration module 320 may be greater than a size of the micro-semiconductor chip 110. For example, the sizes of the channel 322, the inlet 321, and the first outlet 323 and the second outlet 324 may be within a range of 100 μm to 1000 μm.

The chip filtration module 320 may be formed on a substrate formed of at least one of silicon, glass, polymer, plastic, or metal, and the channel 322 of the chip filtration module 320 may be embedded in the substrate. For example, the chip filtration module 320 may be formed by bonding a lower substrate having the plurality of channels 322 formed on its surface, and an upper substrate having the inlet 321 and the first outlet 323 and the second outlet 324 formed while covering the channel 322. The channel 322 of the lower substrate may be formed by forming a negative photoresist on a silicon substrate and then performing partial etching. Alternatively, a plastic plate on which the channel 322 is engraved may be made by injection molding plastic using a patterned metal template.

On the other hand, an anti-adhesive film may be formed on an inner wall of at least one of the channel 322, the inlet 321, and the first outlet 323 and the second outlet 324 of the chip filtration module 320 to prevent the micro-semiconductor chip 110 from sticking to the inner wall and clogging the inner wall. When the micro-semiconductor chip 110 is a light-emitting device including an electrode, the anti-adhesive film may be hydrophobic. In other words, a hydrophobic anti-adhesive layer may be formed on the inner wall of the channel 322 to prevent a hydrophilic electrode from being attached to the inner wall of the channel 322.

The chip filtration module 320 may separate the micro-semiconductor chip 110 and the impurity 120 using at least one of microfluidic dynamics, sonophoretic dynamics, dielectrophoretic dynamics, magnetophoretic dynamics, a centrifugal force, and pinched flow fractionation.

Figure 5A:
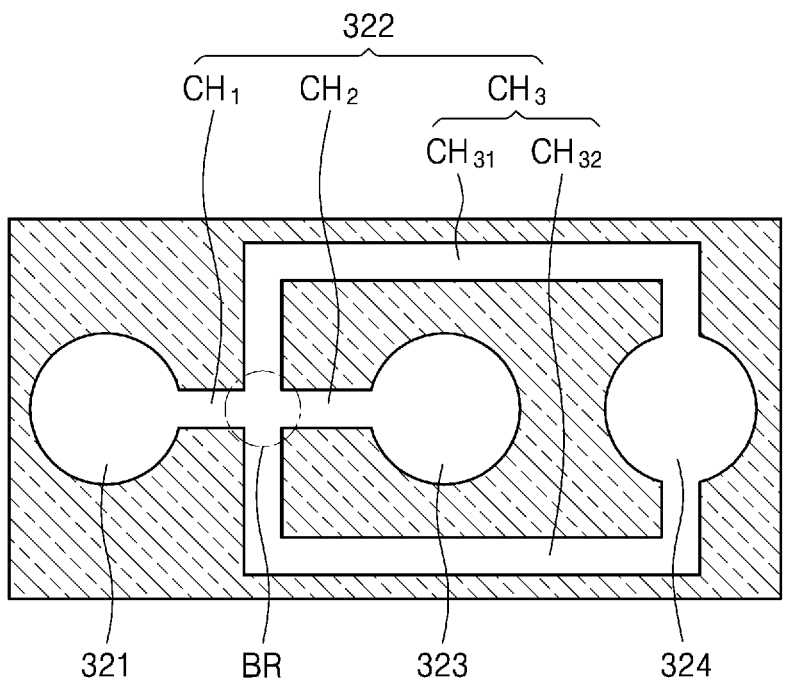
FIG. 5A is a schematic view of a chip filtration module for separating a micro-semiconductor chip using microfluidic dynamics, according to an example embodiment.
Figure 5B:
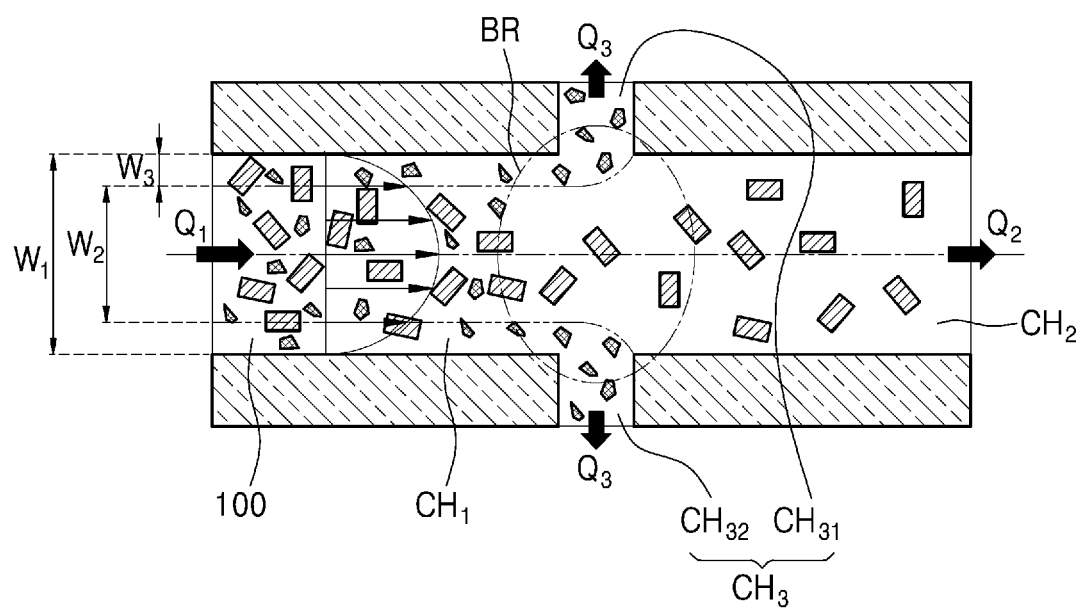
FIG. 5B is a plan view of a channel around a branching area of FIG. 5A.
Figure 5C:
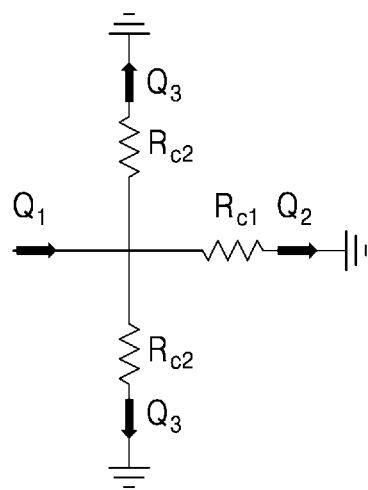
FIG. 5C is an equivalent circuit diagram of the channel around a branching area of FIG. 5B.

FIG. 5A is a schematic view of the chip filtration module 320 for separating the micro-semiconductor chip 110 using microfluidic dynamics according to an example embodiment, FIG. 5B is a plan view of the channel 322 around a branching area of FIG. 5A, and FIG. 5C is an equivalent circuit diagram of the channel 322 around a branching area of FIG. 5B.

The chip filtration module 320 according to an example embodiment may separate the micro-semiconductor chip 110 in a continuous flow of the suspension 100 using microfluidic dynamics. The chip filtration module 320 may include the inlet 321 through which the suspension 100 is introduced from the chip storage module 310, the channel 322 connected to the inlet 321 and through which the suspension 100 flows, the first outlet 323 connected to the channel 322 and discharging a first suspension to the chip supply module 330, and the second outlet 324 connected to the channel 322 and discharging the second suspension to the outside.

The channel 322 may include a branching area BR, a first channel $CH_1$ connecting the inlet 321 to the branching area BR, a second channel $CH_2$ connecting the branching area BR to the first outlet 323, and a third channel $CH_3$ connecting the branching area BR to the second outlet 324. All of the first to third channels $CH_1$, $CH_2$, and $CH_3$ may be connected to the branching area BR, and the first channel $CH_1$ and the second channel $CH_2$ may have the same length direction. According to an example embodiment, the branching area BR may provide a path for the micro-semiconductor chip 110 and a path of impurities 120.

The third channel $CH_3$ may include first and second sub-channels $CH_{31}$ and $CH_{32}$ apart from each other with the second channel $CH_2$ therebetween. The first and second sub-channels $CH_{31}$ and $CH_{32}$ may have a symmetrical structure with respect to the second channel $CH_2$. The dimension of the first channel $CH_1$ may be greater than the dimension of the second and third channels $CH_3$, and the dimension of the second channel $CH_2$ may be greater than the dimension of the third channel $CH_3$.

Referring to FIG. 5B, in the branching area BR where the first channel $CH_1$, the second channel $CH_2$, and the third channel $CH_3$ meet, a flow rate $Q_1$ for the suspension 100 of the first channel $CH_1$ is divided into flow rates $Q_2$ and $Q_3$ for the first suspension and the second suspension flowing into the second channel and the third channel.

When an incompressible fluid flows in a laminar flow with pressure actuation, a flow profile in a channel may be parabolic. Thus, a volumetric flow rate Q in each of the channels $CH_1$, $CH_2$, and $CH_3$ may be expressed by Equation 1 below.

$$Q = \Delta P \times D_r^2 \frac{wd}{32\mu L} = \Delta P \times \frac{1}{R_h}. \quad \text{[Equation 1]}$$

Where $\Delta P$ is a pressure difference at both ends of each channel, $D_r$ is a hydraulic diameter of each channel, w is a width of the channel 322, d is a depth of the channel 322, μ is viscosity of a fluid, that is, the suspension 100, and L is a length of the channel 322. In addition, Rh is hydrodynamic resistance of the channel 322.

When a cross section of each channel is a rectangle, the mathematical diameter of the channel is expressed by Equation 2 below.

$$D_r = 2wd/(w+d) \quad \text{[Equation 3]}$$

A flow rate distribution in the branching area BR that determines a path of particles included in the suspension 100, that is, the micro-semiconductor chip 110 and the impurity 120, may be the same as an electric circuit approximation channel network of FIG. 5C. That is, when a ratio of the flow rate $Q_1$ in the first channel $CH_1$ to the flow rate $Q_2$ in the second channel $CH_2$ is α, it is $\alpha = R_{c2}/(2R_{c1}+R_{c2})$ with reference to FIG. 5C.

When a flow profile is perfectly parabolic as shown in FIG. 5B and the distribution of particles in a channel depth direction is negligible, a ratio of a volumetric flow rate is equal to a ratio of the area of a parabolic distribution and a ratio of the reciprocal of hydrodynamic equivalent resistance, as shown in FIG. 4 below.

$$Q_2:Q_1=\alpha:(1-\alpha)/2=S_2:S_3=1/R_{c1}:1/R_{c2},\quad\text{[Equation 4]}$$

Accordingly, in the parabolic profile, a width $W_3$ of the second suspension flowing into the third channel $CH_3$ may be inferred from a width W1 and α of the first channel $CH_1$. Particles having a diameter greater than the virtual width $W_3$ may not flow into the third channel $CH_3$ but may flow into the second channel $CH_2$. Moreover, a width $W_2$ may correspond to a portion of the width $W_1$ after the width $W_3$ is subtracted from both sides of width $W_1$. For instance, $W_2=W_1-(2*W_3)$.

Particles separated and discharged through the first outlet 323 and the second outlet 324 by the principle of microfluidic dynamics may be determined by the size of the channel 322. In more detail, by adjusting a width, depth, and length of the channel 322 of the chip filtration module 320 and pressure of the suspension 100 flowing through the chip filtration module 320, the suspension 100 may pass through the second channel $CH_2$ and the impurity 120 may pass through the third channel $CH_3$. For example, the first outlet 323 may discharge a first suspension 101 including the micro-semiconductor chip 110 through the second channel $CH_2$, and the second discharge port 324 may discharge a second suspension 102 including the impurity 120 through the third channel $CH_3$.

Figure 6:
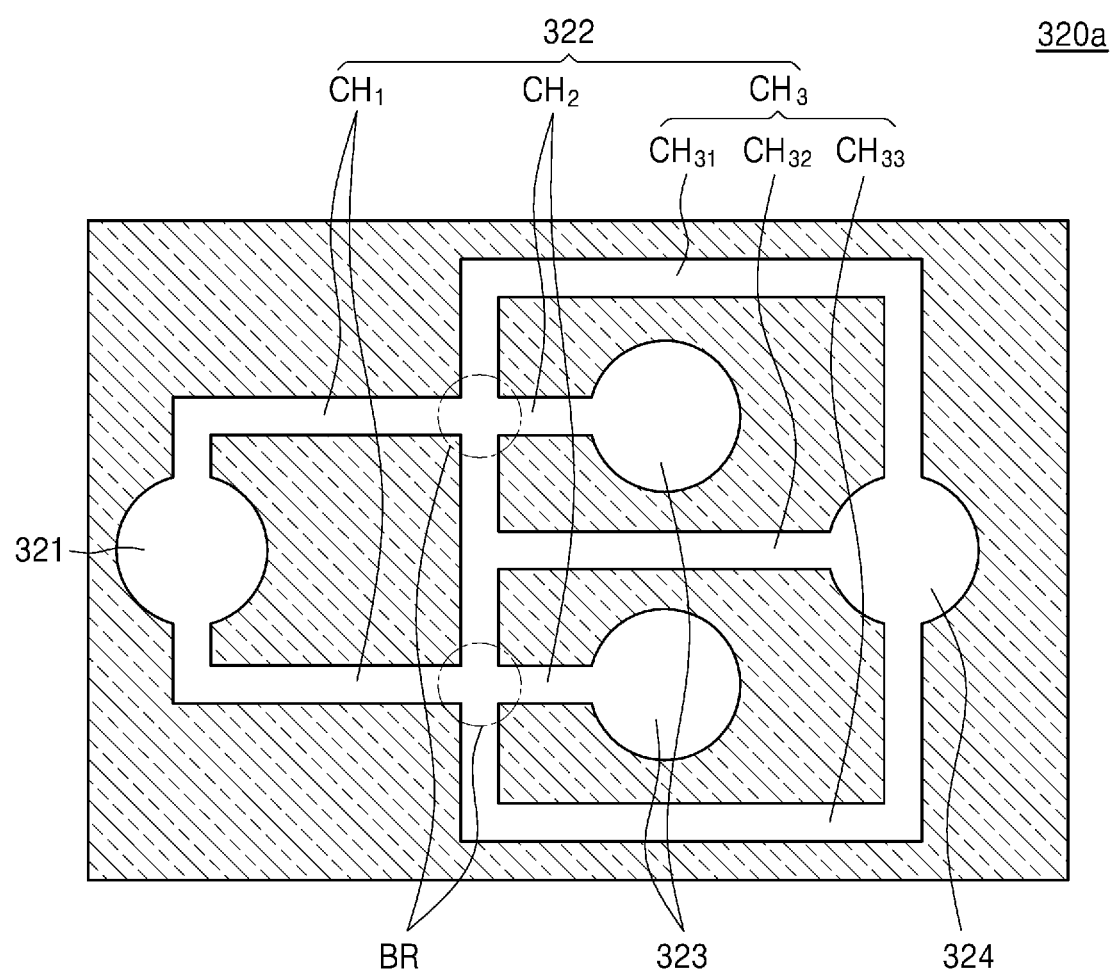
FIG. 6 is a view of a chip filtration module according to another example embodiment.

FIG. 6 is a view of a chip filtration module 320a according to another example embodiment.

Referring to FIG. 6, the chip filtration module 320a may include the inlet 321 through which the suspension 100 is introduced from the chip storage module 310, the channel 322 connected to the inlet 321 and through which the suspension 100 flows, a plurality of first outlets 323 connected to the channel 322 and discharging a first suspension to the chip supply module 330, and the second outlet 324 connected to the channel 322 and discharging the second suspension to the outside.

The channel 322 may include a plurality of branching areas BR, a plurality of first channels $CH_1$ connecting the inlet 321 to the branching areas BR, a plurality of second channels $CH_2$ connecting the first channels $CH_1$ to the first outlets 323, and a plurality of third channels $CH_{31}$, $CH_{32}$, and $CH_{32}$ connecting the branching areas BR to the second outlet 324. All of the first to third channels $CH_1$, $CH_2$, and $CH_3$ may be connected to the branching area BR, and the first channel $CH_1$ and the second channel $CH_2$ may have the same length direction.

The third channel $CH_3$ may include the first and second sub-channels $CH_{31}$ and $CH_{32}$ from each other with the plurality of second channels $CH_2$ therebetween, and the third sub-channel $CH_{33}$ arranged between the second channels $CH_2$. As described above, because the chip filtration module 320 has a structure having a plurality of flow paths from one flow path, the amount of chip filtration processing may be increased, and more micro-semiconductor chips 110 may be simultaneously transferred, thereby reducing the transfer time.

Figure 7:
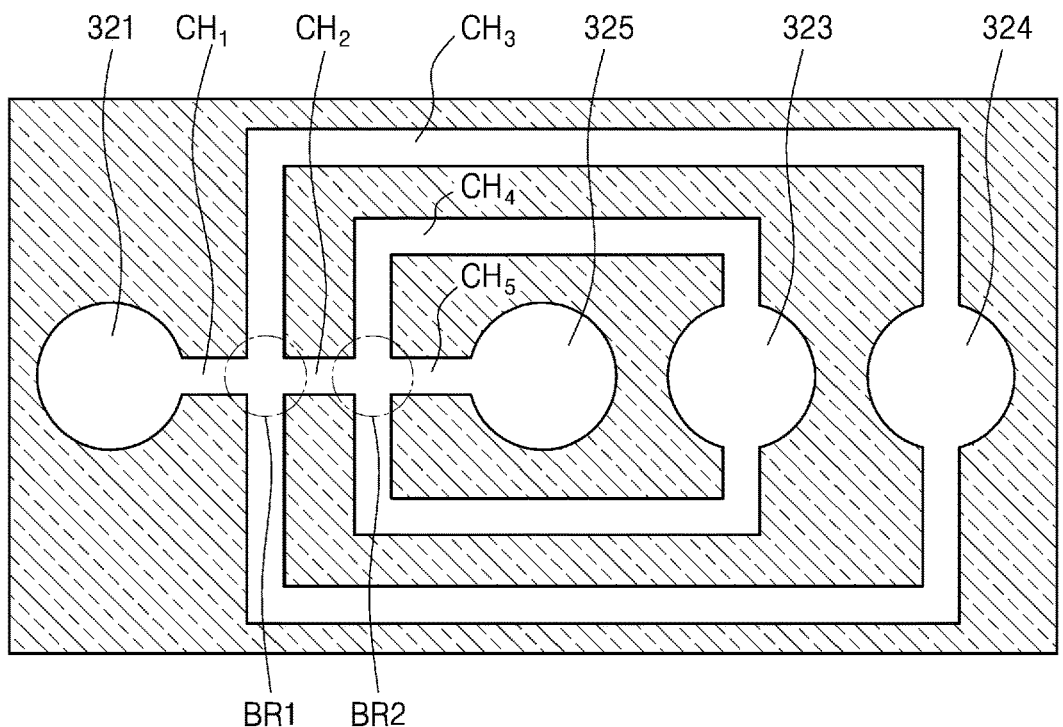
FIG. 7 is a view of a chip filtration module according to another example embodiment.

FIG. 7 is a view illustrating a chip filtration module 320b according to another example embodiment.

The chip filtration module 320b of FIG. 7 may separate the micro-semiconductor chip 110 and the impurity 120 as well as further subdivide and separate the impurity 120. According to an example embodiment, the impurity 120 may include the micro-semiconductor chip debris. The impurity 120 may be greater or smaller in size or mass than the micro-semiconductor chip 110. When the impurity 120 is generated by fragments of the micro-semiconductor chip 110 during a stirring process of the micro-semiconductor chip 110, the size of the impurity 120 may be generally smaller than that of the micro-semiconductor chip 110. However, a micro-semiconductor chip used in another transfer process may be greater than the micro-semiconductor chip 110 to be transferred. When the micro-semiconductor chip 110 is separated by the chip filtration modules 320 and 320a according to FIGS. 5A and 6, impurities larger than the micro-semiconductor chip 110 may be introduced into the chip supply module 330 without being separated.

As shown in FIG. 7, the chip filtration module 320b may include the inlet 321 through which the suspension 100 is introduced from the chip storage module 310, the channel 322 through which the suspension 100 flows, the first outlet 323 for discharging a first suspension including the micro-semiconductor chip 110 to the chip supply module 330, a second outlet 324a for discharging a second suspension including the impurity 120 smaller than the micro-semiconductor chip 110, a third outlet 324b for discharging third suspension 103 including the impurity 120 greater than the micro-semiconductor chip 110 to the outside.

The channel 322 may include a plurality of branching areas BR1 and BR2 separating the micro-semiconductor chip 110 and the impurity 120. For example, the channel 322 may include a first branching area BR1 separating the micro-semiconductor chip 110 and the impurity 120 smaller than the micro-semiconductor chip 110, and a second branching area BR2 separating the micro-semiconductor chip 110 and the impurity 120 greater than the micro-semiconductor chip 110.

The channel 322 may include a first channel $CH_1$ connecting the inlet 321 to the first branching area BR1, a second channel $CH_2$ connecting the first branching area BR1 to the second branching area BR2, the third channel $CH_3$ connecting the first channel $CH_1$ to the second outlet 324, a fourth channel $CH_4$ connecting the second branching area BR2 to the second outlet 324, and a fifth channel $CH_5$ connecting the second branching area BR2 to a third outlet 325.

From the chip storage module 310, the suspension 100 including the micro-semiconductor chip 110 and the impurity 120 is introduced into the channel 322 through the inlet 321, an impurity (hereinafter referred to as a 'first impurity') smaller than the micro-semiconductor chip 110 in the suspension 100 may be separated from the first branching area BR1 by microfluidic dynamics, and the second suspension including the separated first impurity may be discharged to the second outlet 324 through the third channel $CH_3$. Suspension from which the first impurity has been removed, that is, suspension including the micro-semiconductor chip 110 and the impurity 120 (hereinafter referred to as 'second impurity') greater than the micro-semiconductor chip 110, may pass through the second channel $CH_2$ and reach the second branching area BR2. In the second branching area BR2, the micro-semiconductor chip 110 and the second impurity are separated by microfluidic dynamics, and the suspension including the micro-semiconductor chip 110 is introduced into the first outlet 324 through the fourth channel $CH_4$. In addition, the suspension including the second impurity 120 is introduced into the third outlet 325 through the fifth channel $CH_5$.

The first outlet 323 may be connected to the chip supply module 330, and the second and third outlets 324 and 325 may be connected to the impurity storage module 340. Thus, the chip supply module 330 may transfer the micro-semiconductor chip 110 to the transfer substrate 200. Because the chip filtration module 320b includes a plurality of branching areas, the impurity 120 may be separated in more detail to increase chip filtration efficiency.

It is not necessary to include a plurality of branching areas to separate impurities or micro-semiconductor chips in detail. Even with a single branching area, impurities may be separated in detail.

Figure 8:
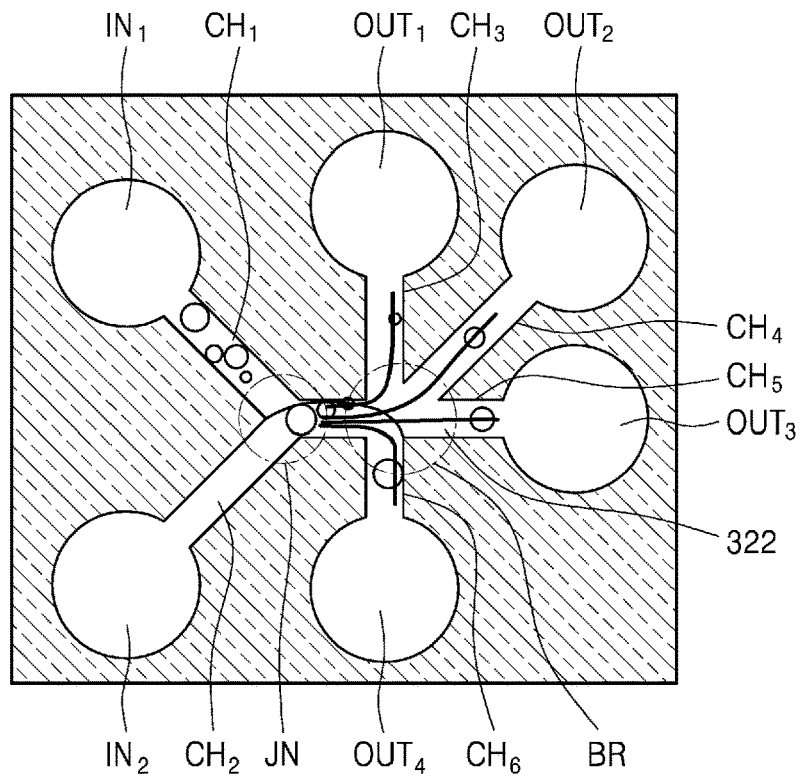
FIG. 8 is a schematic view of a chip filtration module based on pinched flow fractionation, according to an example embodiment.

FIG. 8 is a schematic view of a chip filtration module 320c based on pinched flow fractionation according to an example embodiment. The chip filtration module 320c shown in FIG. 8 may include a plurality of inlets, a plurality of channels, and a plurality of outlets. For example, the chip filtration module 320c may include a first inlet $IN_1$ through which the suspension 100 including the micro-semiconductor chip 110 and the impurity 120 applied from the chip storage module 310 is introduced, a second inlet $IN_2$ through which only particle-free liquid flows in, a channel $CH_1$ through which the suspension 100 and the liquid L flow, a channel $CH_2$ through which the particle-free liquid flows, first to fourth outlets $OUT_1$, $OUT_2$, $OUT_3$, and $OUT_4$ through which micro-semiconductor chips 110 or impurities 120 having different sizes are discharged, respectively, and a channel 322 connecting between the first to fourth outlets $OUT_1$, $OUT_2$, $OUT_3$, and $OUT_4$ and channels $CH_1$ and $CH_2$.

The channel 322 may include the branching area BR in which micro-semiconductor chips 110 or impurities 120 having different sizes or masses are separated according to pinched flow fractionation. In addition, the channel 322 may include the first channel $CH_1$ connected to the first inlet $IN_1$, the second channel $CH_2$ connected to the second inlet $IN_2$, the branching area BR, and the third to sixth channels $CH_3$, $CH_4$, $CH_5$, and $CH_6$ respectively connected to the first to fourth outlets $OUT_1$, $OUT_2$, $OUT_3$, and $OUT_4$. The first channel $CH_1$ may include a confluence area JN in which the suspension 100 and the liquid L respectively introduced through the first and second inlets $IN_1$ and $IN_2$ meet.

The suspension 100 may be introduced through the first inlet $IN_1$, and the liquid L may be introduced through the second inlet $IN_2$. The liquid L may be a liquid contained in the suspension 100. However, the disclosure is not limited thereto. The suspension 100 and the liquid L meet in the confluence area JN in the first channel $CH_1$, and particles included in the suspension 100, that is, the micro-semiconductor chip 110 and the impurities 120, form different streamlines depending on the size or mass. For example, when the suspension 100 and the liquid L meet in the confluence area JN, a streamline may be sequentially formed from small particles to large particles in a direction of the liquid L in the suspension 100. Thus, the smallest particle may be discharged through the first outlet $OUT_1$ and the largest particle may be discharged through the fourth outlet $OUT_4$. Any one of the first to fourth outlets $OUT_1$, $OUT_2$, $OUT_3$, and $OUT_4$ may discharge a micro-semiconductor chip having a constant size.

Figure 9:
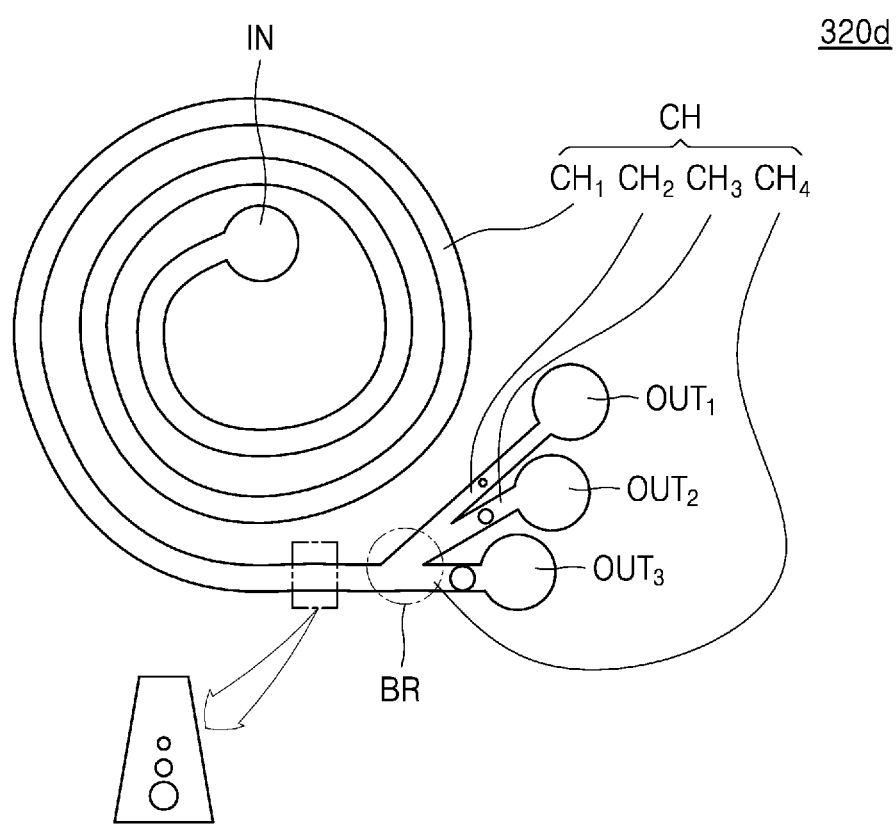
FIG. 9 is a schematic view of a chip filtration module based on centrifugal force, according to an example embodiment.

According to an example embodiment, the chip filtration module 320c may separate the micro-semiconductor chip 110 and the impurity 120 by a centrifugal force. FIG. 9 is a schematic view of a chip filtration module 320d based on a centrifugal force according to an example embodiment. The chip filtration module 320d illustrated in FIG. 9 may include an inlet IN, the channel CH, and the first to third outlets $OUT_1$, $OUT_2$, and $OUT_3$.

The channel CH may include the branching area BR in which micro-semiconductor chips 110 or impurities 120 having different sizes or masses are separated according to a centrifugal force. In addition, the channel CH may include the first channel $CH_1$ connecting the inlet IN to the branch area BR, and the second to fourth channels $CH_2$, $CH_3$, and $CH_4$ respectively connecting the branching area BR to the first to third outlets $OUT_1$, $OUT_2$, and $OUT_3$. In particular, the first channel $CH_1$ may have a spiral shape.

When the suspension 100 is introduced through the inlet IN, the suspension 100 is subjected to a centrifugal force while flowing through the spiral first channel $CH_1$. Thus, as the first channel $CH_1$ goes from the center to the outside, large particles included in the suspension 100 may be arranged. Accordingly, the first outlet 323 may discharge the smallest particles (impurities or micro-semiconductor chips), and the third outlet may discharge the largest particles (impurities or micro-semiconductor chips). Any one of the first to third outlets $OUT_1$, $OUT_2$, and $OUT_3$ may discharge micro-semiconductor chips 100 having constant sizes.

Although it has been said that the micro-semiconductor chip 110 and the impurity 120 included in the suspension 100 are separated by the structure of the chip filtration module 320 so far, the disclosure is not limited thereto. The micro-semiconductor chip 110 and the impurity 120 may be separated even by an active external force. The active external force may be sonophoretic dynamics, magnetophoretic dynamics, or the like. The micro-semiconductor chip 110 and the impurity 120 may be separated by at least one of a structure of a chip filtration module and an active external force.

Figure 10:
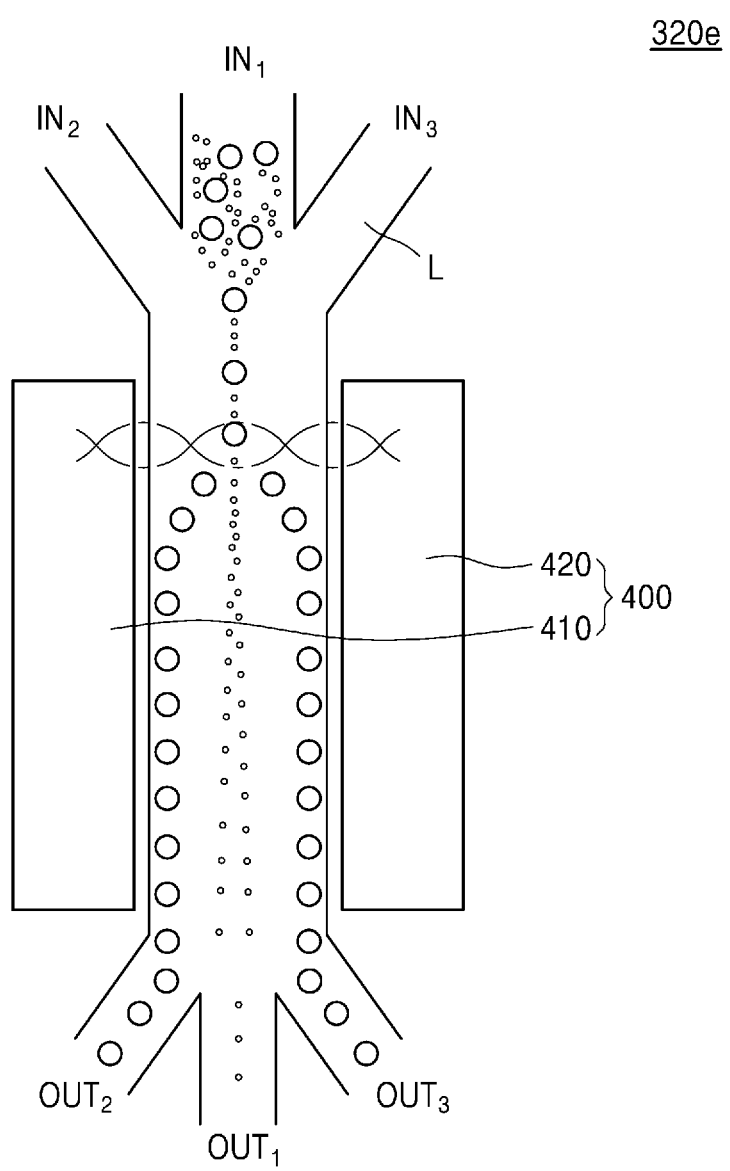
FIG. 10 is a schematic view of a chip filtration module based on sound waves, according to an example embodiment.

FIG. 10 is a view schematically illustrating a chip filtration module 320e based on sound waves according to an example embodiment. Referring to FIG. 10, the chip filtration module 320e may include the first inlet $IN_1$ through which the suspension 100 is introduced, second and third inlets $IN_2$ and $IN_3$ through which a liquid flows, the channel CH through which the suspension 100 and the liquid flow, the first outlet $OUT_1$ through which small particles are discharged, and the second and third outlets $OUT_2$ and $OUT_3$ through which large particles are discharged.

In addition, the chip filtration module 320e may further include a sound wave providing unit 400 that provides a sound wave to the channel CH. The sound wave providing unit 400 may include a sound wave generator 410 arranged on a first sidewall of the channel CH and a reflector 420 arranged on a second sidewall facing the first sidewall of the channel CH. The sound wave generator 410 may be a transducer. A sound wave generated by the sound wave generator 410 may travel across the channel CH and be reflected by the reflector 420. The reflected sound wave may form a standing wave in the channel CH together with the sound wave generated by the sound wave generator 410.

When the suspension 100 including the micro-semiconductor chip 110 and the impurity 120 is introduced through the first inlet $IN_1$, the suspension 100 flows through the channel CH. The sound wave providing unit 400 may provide an ultrasonic wave to the suspension 100. The ultrasonic wave may be a standing wave. Due to mechanical properties of the micro-semiconductor chip 110 and the impurity 120, a difference in the force exerted by the ultrasonic wave on the micro-semiconductor chip 110 and the impurity 120 occurs. For example, a small amplitude may be formed at the edge of the channel CH, and a large amplitude may be formed in the central area of the channel CH. Thus, particles having a large size or mass from among the particles included in the suspension 100 converge to the edge of the channel CH as they pass through the channel CH, and particles having a small size or mass from among the particles included in the suspension 100 converge to the central area of the channel 322 as they pass through the channel 322.

Therefore, small particles may be discharged through the first outlet $OUT_1$ connected to the central area of the channel 322, and large particles may be discharged through the second and third outlets $OUT_2$ and $OUT_3$ connected to the edge of the channel CH. When a large particle is the micro-semiconductor chip 110, the micro-semiconductor chip 110 may be discharged through the first outlet $OUT_1$.

Although it has been said that the micro-semiconductor chip 110 and the impurity 120 are discharged through different outlets, the disclosure is not limited thereto. The micro-semiconductor chip 110 and the impurity 120 may be discharged through the same outlet. In this case, a separation effect may be obtained by discharging the micro-semiconductor chip 110 and the impurity 120 with a time difference. For example, the channel 322 may have a curved shape in a vertical direction of a substrate, and a surface acoustic wave may be provided to the channel 322. Particles are separated at a pressure point caused by superposition of surface acoustic waves, so that small-sized particles may flow rapidly through the channel 322, and large-sized particles may flow relatively slowly. Therefore, the impurity 120 and the micro-semiconductor chip 110 may be sequentially discharged according to time through one outlet.

In addition, when the micro-semiconductor chip 110 has magnetism, a non-magnetic impurity 120 may be separated by an externally applied magnetic field. Alternatively, the micro-semiconductor chip 110 and the impurity 120 may be separated in the channel 322 by dielectrophoresis.

Referring back to FIG. 4, the chip transfer module 10 may further include the chip supply module 330 for supplying the first suspension on the transfer substrate 200 such that the first suspension including the micro-semiconductor chip 110 may be introduced from the chip filtration module 320 and the micro-semiconductor chip 110 may flow on the transfer substrate 200.

A method in which the chip supply module 330 supplies the first suspension on the transfer substrate 200 may vary.

Figure 11:
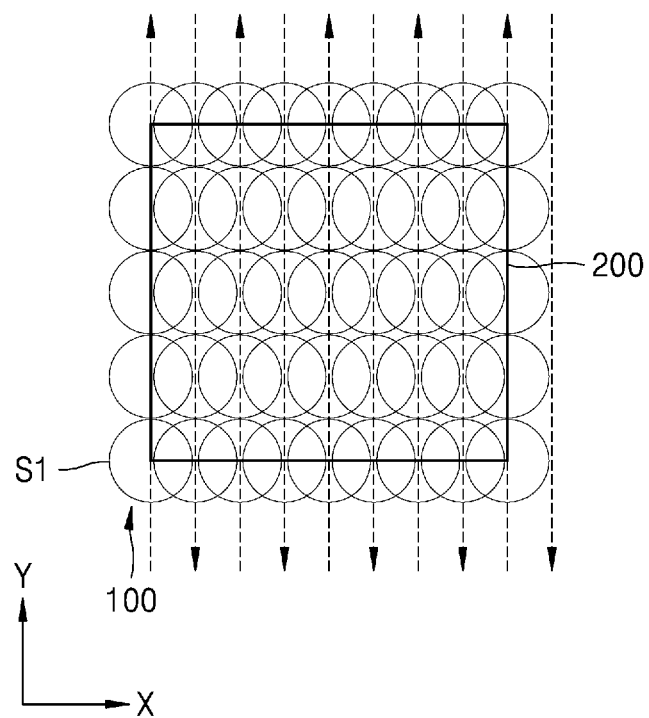
FIGS. 11 to 16 are views for explaining an example of a method of supplying a liquid onto a transfer substrate by a liquid supply module, according to an example embodiment.
Figure 12:
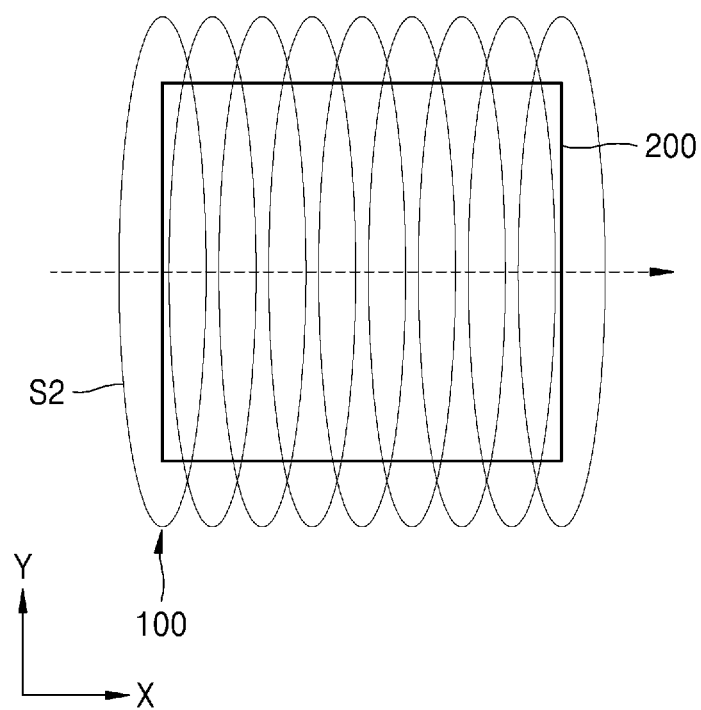
Figure 13:
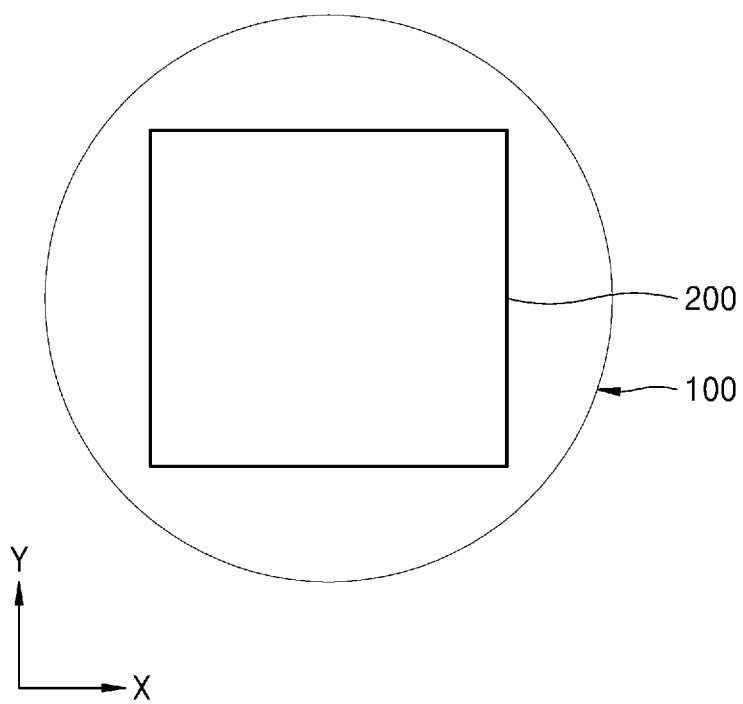
Figure 14:
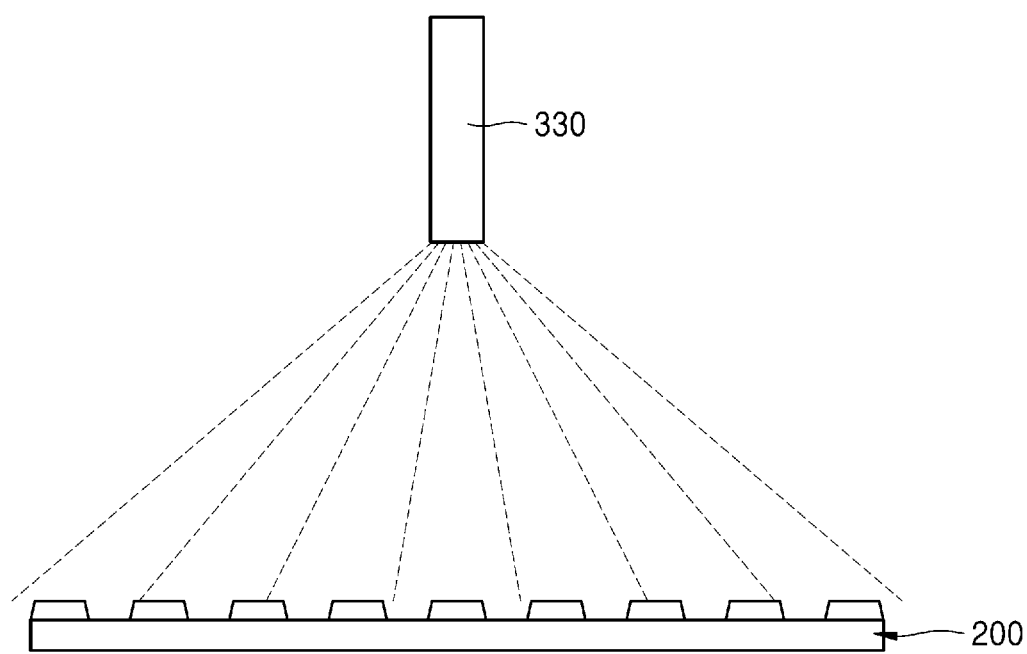

FIGS. 11 to 16 are reference views for explaining methods of supplying a first suspension to a transfer substrate according to an example embodiment. The chip supply module 330 may move the chip supply module 330 in a horizontal direction and/or a vertical direction to evenly supply the first suspension on the transfer substrate 200. As shown in FIG. 11, the chip supply module 330 supplies the first suspension in a dot shape S1 to a portion of the transfer substrate 200, and may move the first suspension in a vertical direction Y and a horizontal direction X, or as shown in FIG. 12, the chip supply module 330 supplies the first suspension in an elongated shape S2 in the vertical direction Y, and may move the first suspension in the horizontal direction X. As another example, as shown in FIGS. 13 and 14, the chip supply module 330 may supply the first suspension to an area greater than the transfer substrate 200.

Figure 15:
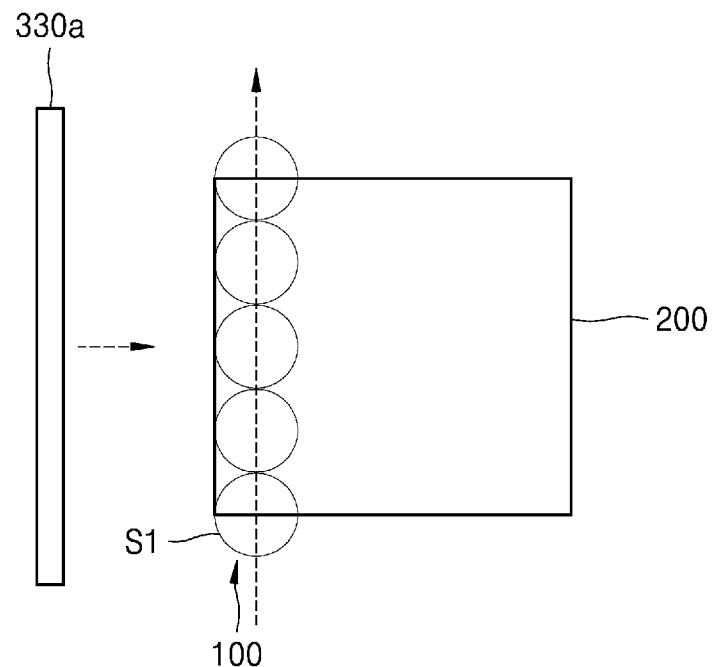
Figure 16:
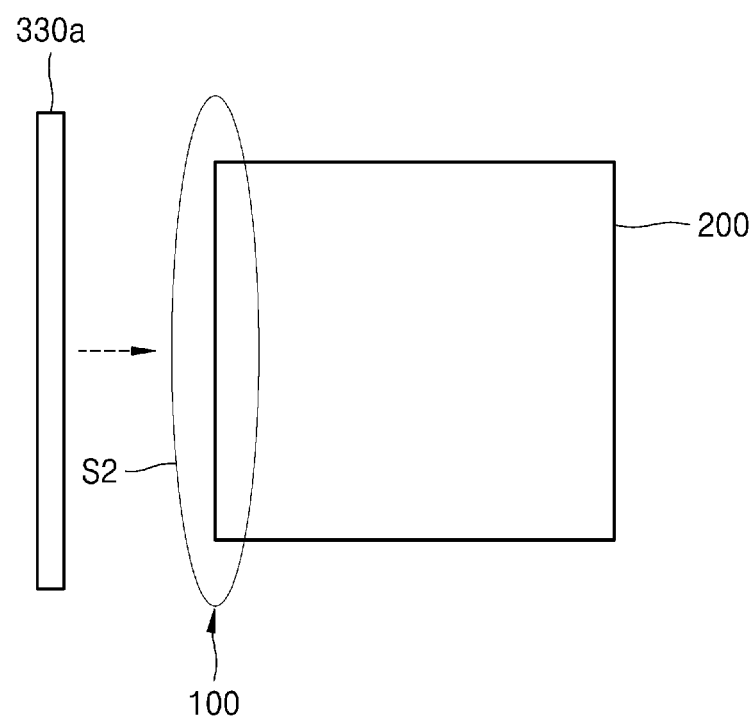

As another example, as shown in FIGS. 15 and 16, the chip supply module 330 supplies a relatively large amount of the first suspension to a partial area of the transfer substrate 200 in the dot shape S1 or the elongated shape S2 in the vertical direction Y. Thereafter, by using a height limiting member 111 such as a blade to evenly spread the first suspension supplied onto the transfer substrate 200, a thin film may be formed on the transfer substrate 200.

Figure 17:
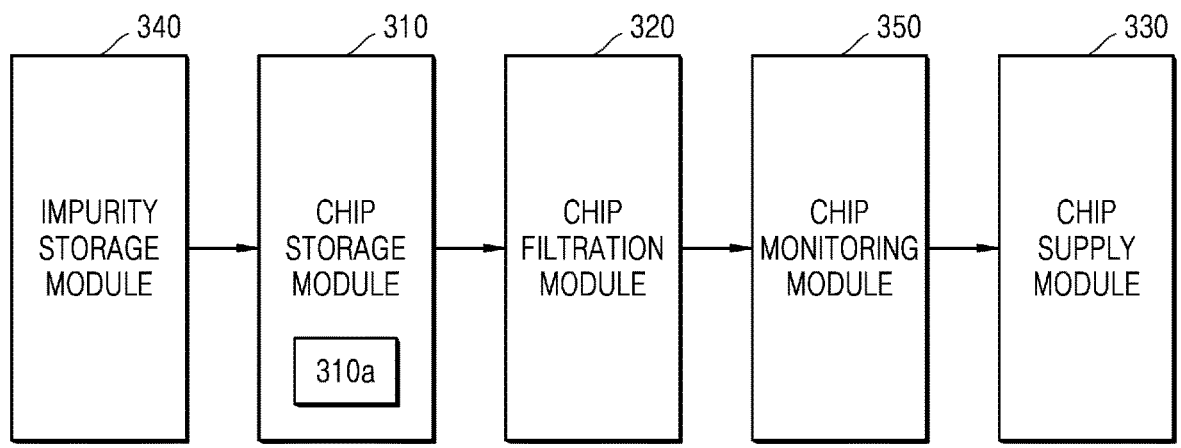
FIG. 17 is a view for explaining a chip transfer module according to another example embodiment.

FIG. 17 is a view for explaining a chip transfer module 10a according to another example embodiment. Comparing FIG. 4 and FIG. 17, the chip transfer module 10a of FIG. 17 may further include at least one of a concentration measurement module 310a for measuring the concentration of a chip in the chip storage module 310 and a chip monitoring module 350 for monitoring a state of the micro-semiconductor chip 110 flowing into the chip supply module 330.

The concentration measuring module 310a may measure the concentration of the micro-semiconductor chip 110 in the chip storage module 310 and control a stirrer to operate when the concentration of the micro-semiconductor chip 110 is equal to or greater than a reference value. Therefore, by supplying an excessive amount of micro-semiconductor chips 110 to the chip filtration module 320, it is possible to prevent the micro-semiconductor chip 110 from blocking the channel 322 in the chip filtration module 320.

Even if the impurity 120 is removed from the first suspension contained in the micro-semiconductor chip 110, a separation efficiency of the micro-semiconductor chip 110 and the impurity 120 is reduced due to continuous use of the chip filtration module 320. The chip monitoring module 350 may monitor a state of the micro-semiconductor chip 110 flowing into the chip supply module 330 and replace the chip filtration module 320 when an abnormality is found.

Figure 18:
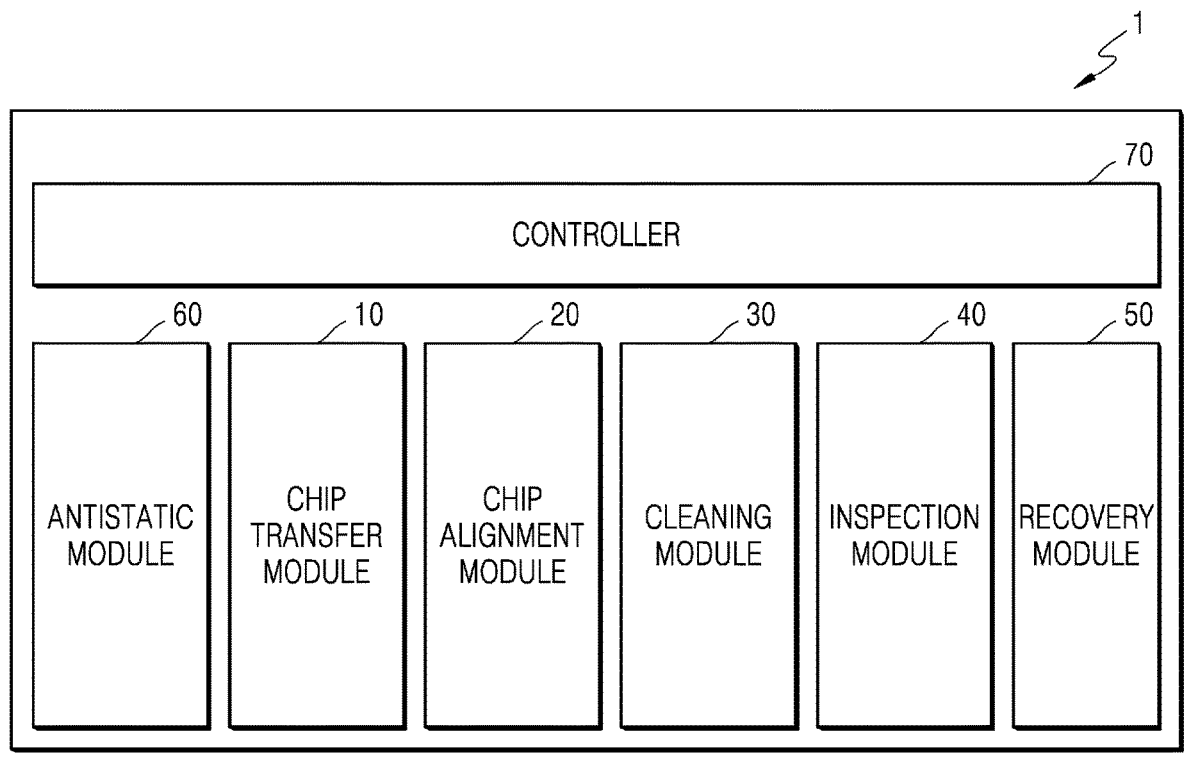
FIG. 18 is a view of a chip transfer apparatus including a chip transfer module, according to an example embodiment.

FIG. 18 is a view illustrating a chip transfer apparatus 1 including the chip transfer module 10 according to an example embodiment. In addition to the chip transfer module 10, the chip transfer apparatus 1 may further include at least one of the chip alignment module 20, a cleaning module 30, an inspection module 40, a recovery module 50, an antistatic module 60, and a controller 70 for controlling all operations of the chip transfer apparatus 1. Because the chip transfer module 10 has been described above, a detailed description thereof will be omitted. Hereinafter, the chip alignment module 20, the cleaning module 30, the inspection module 40, the recovery module 50, and the antistatic module 60 will be sequentially described.

Figure 19:
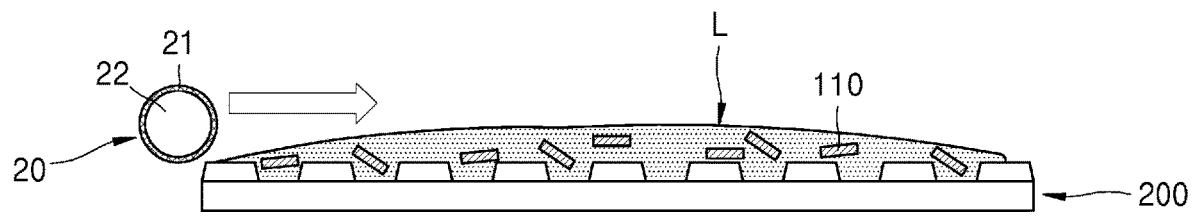
FIG. 19 is a conceptual diagram for explaining the operation of a chip alignment module according to an example embodiment.

Referring to FIG. 19, the chip alignment module 20 includes an absorbent material 21 that absorbs the liquid L. The transfer substrate 200 may be scanned with the absorbent material 21. The chip alignment module 20 may move the absorbent material 21 along a surface of the transfer substrate 200. The absorbent material 21 may move along the surface of the transfer substrate 200 while in contact with the transfer substrate 200.

The absorbent material 21 may include, for example, fabric, tissue, polyester fiber, paper, or a wiper.

Figure 20:
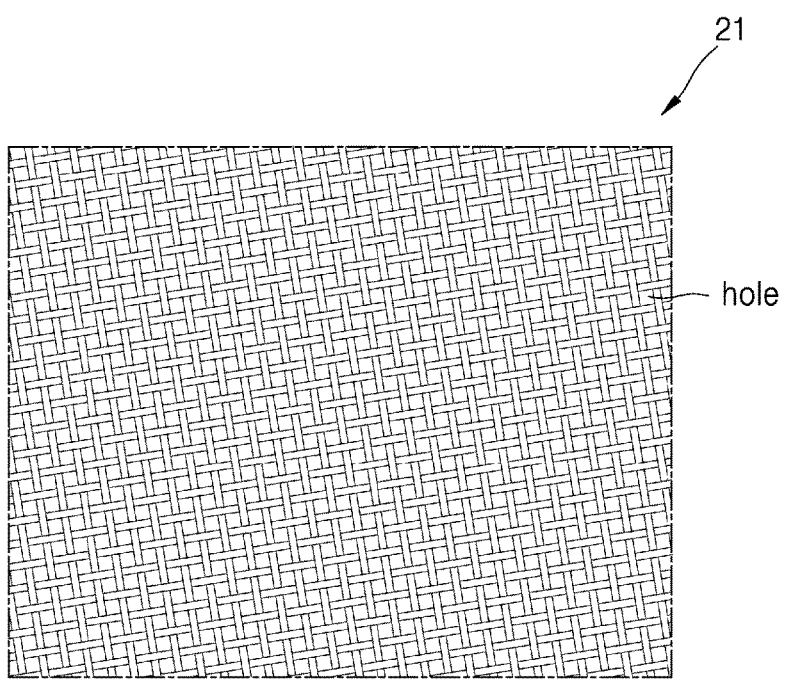
FIG. 20 is a view for explaining an example of an absorbent material according to an example embodiment.

The absorbent material 21 may have a structure in the form of a mesh capable of absorbing the liquid L. Referring to FIG. 20, the absorbent material 21 has a plurality of mesh holes, and the size of such a mesh hole may be less than that of the micro-semiconductor chip 110 to prevent the micro-semiconductor chip 110 from being stuck or pinched.

The absorbent material 21 may be used alone without other auxiliary devices. However, the disclosure is not limited thereto, and the absorbent material 21 may be coupled to a support 22 to conveniently scan the transfer substrate 200 with the absorbent material 21. The support 22 may have various shapes and structures suitable for scanning the transfer substrate 200. The support 22 may include, for example, a rod, a blade, a plate, or a wiper. The absorbent material 21 may be provided on either side of the support 22, or may have a shape wound around the support 22.

Figure 21:
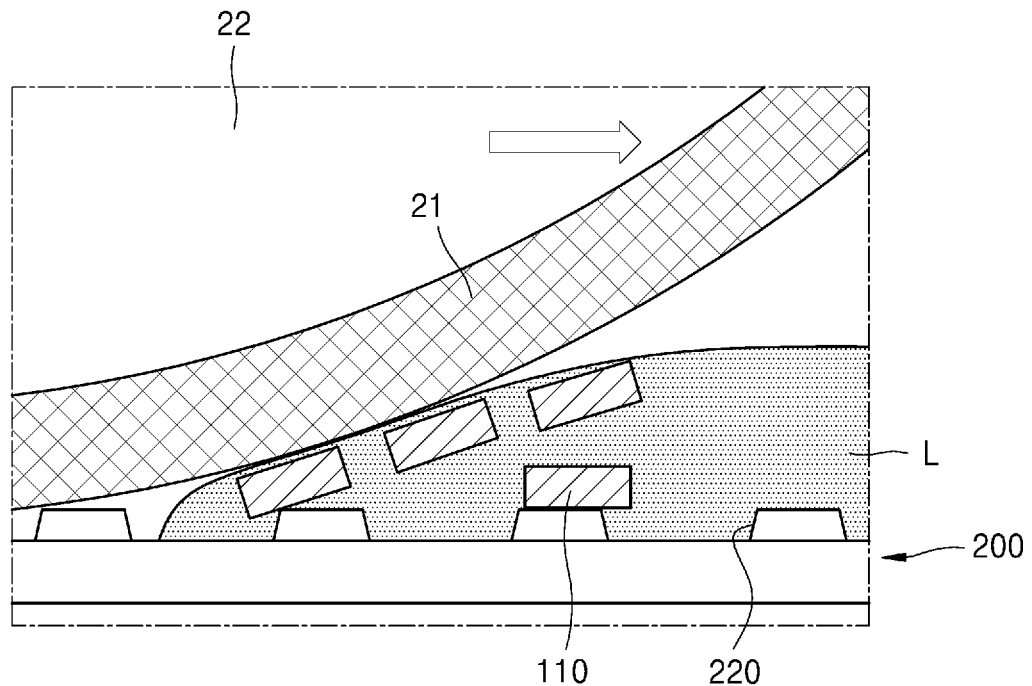
FIGS. 21 to 23 are views for explaining an operation of a chip alignment module according to an example embodiment.

The chip supply module 330 may scan the transfer substrate 200 while the absorbent material 21 presses the transfer substrate 200 to an appropriate pressure. Referring to FIG. 21, in a scanning operation, the absorbent material 21 may contact the transfer substrate 200 and pass through the plurality of grooves h. The liquid L may be absorbed by the absorbent material 21 during scanning.

Scanning may be performed in various ways including, for example, at least one of a sliding method, a rotating method, a translating motion method, a reciprocating motion method, a rolling method, a spinning method, or a rubbing method of the absorbent material 140, and may include both a regular method and an irregular method. Alternatively, the scanning may include at least one of a rotational motion, a translational motion, a rolling motion, or spinning of the transfer substrate 200. Alternatively, the scanning may be performed by cooperation of the absorbent material 21 and the transfer substrate 200. For example, the scanning may proceed by moving or rotating the transfer substrate 200 while the absorbent material 21 presses the transfer substrate 200.

Scanning the transfer substrate 200 with the absorbent material 21 may include absorbing the liquid L in the plurality of grooves h while the absorbent material 21 passes through the plurality of grooves h. The absorbent material 21 may pass through the plurality of grooves h in contact with the transfer substrate 200.

Figure 22:
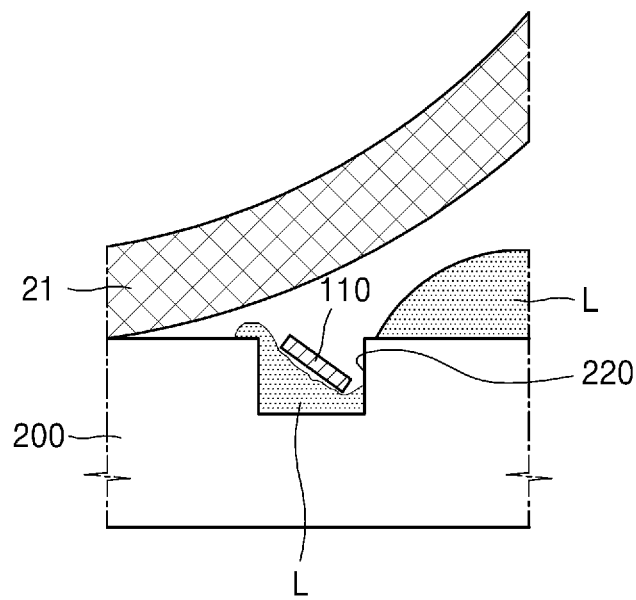

Referring to FIG. 22, when the absorbent material 21 passes through the groove h, the liquid L in the groove h is absorbed, and in the process, the micro-semiconductor chip 110 may be aligned inside the groove h.

Figure 23:
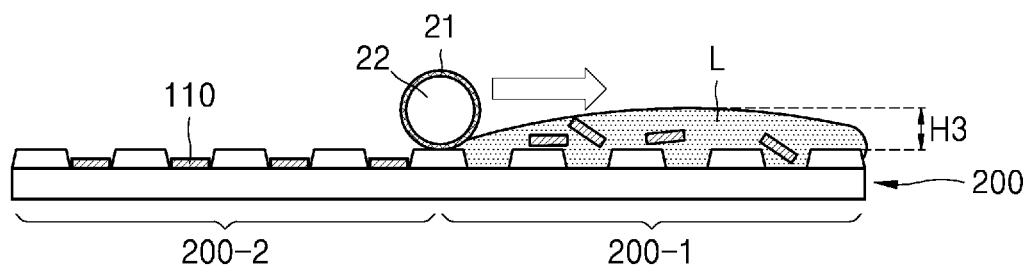

Referring to FIG. 23, the absorbent material 21 absorbs the liquid L present on the transfer substrate 200 while the absorbent material 21 moves along a surface of the transfer substrate 200. Due to the absorption by the absorbent material 21, the amount of the liquid L present on the transfer substrate 200 is changed. For example, the amount of the liquid L present in an area 200-2 of the transfer substrate 200 through which the absorbent material 21 has passed may be different from the amount of the liquid L present in an area 200-1 of the transfer substrate 200 before the absorbent material 21 passes. For example, the amount of the liquid L present in the area 200-2 of the transfer substrate 200 through which the absorbent material 21 has passed may be less than the amount of the liquid L present in the area 200-1 of the transfer substrate 200 before the absorbent material 21 passes. The liquid L may hardly remain in the area 200-2 of the transfer substrate 200 through which the absorbent material 21 has passed. A height of the liquid L present in the area 200-2 of the transfer substrate 200 through which the absorbent material 21 has passed is less than a height H3 of the liquid L present in the area 200-1.

According to the relationship between the micro-semiconductor chip 110 and the liquid L, an alignment state of the micro-semiconductor chip 110 may vary. For example, referring to FIG. 24, a first end 115 of the micro-semiconductor chip 110 may have a first surface property, and a second end 116 of the micro-semiconductor chip 110 may have a second surface property. The first surface property and the second surface property may be opposite to each other. For example, the first surface property may be lyophobic and the second surface property may be lyophilic.

For example, a lyophobic electrode may be arranged at the first end 115 of the micro-semiconductor chip 110, and the second end 116 of the micro-semiconductor chip 110 may be lyophilic. Because the liquid L is inside the groove h, the micro-semiconductor chip 110 may have a relatively stable posture in which the lyophilic second end 116 faces downward and the lyophobic first end 115 faces upward. Accordingly, the liquid L is absorbed while the absorbent material 21 passes through the groove h while in contact with the surface of the transfer substrate 200, and the micro-semiconductor chip 110 is aligned with the first end 115 facing upward.

Figure 24:
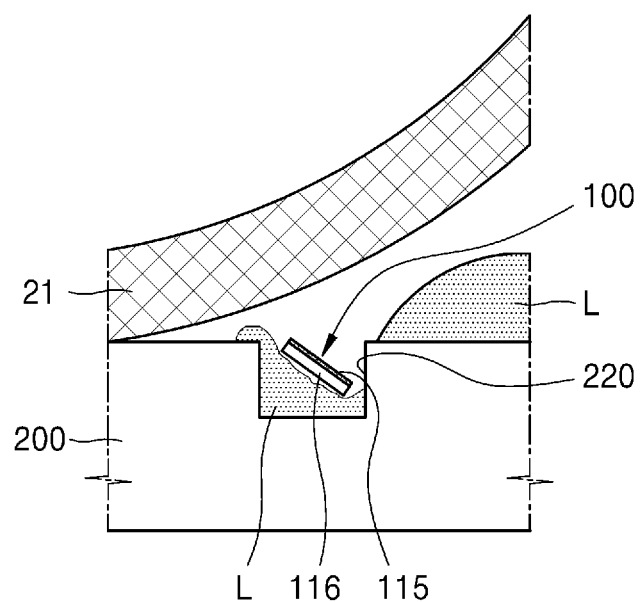
FIGS. 24 and 25 are views illustrating a process in which micro-semiconductor chips having different surface properties are aligned.
Figure 25:
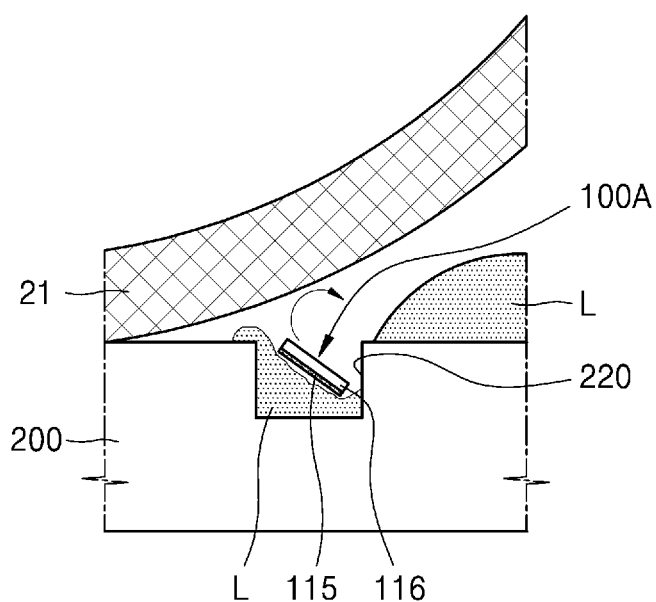

When the micro-semiconductor chip 110 is located in the groove h of the transfer substrate 200 with the first end 115 facing down, as shown in FIG. 25, the lyophobic first end 115 of the micro-semiconductor chip 110 may be in an unstable state due to contact with the liquid L. Accordingly, the liquid L may be absorbed by the absorbent material 21 while the absorbent material 21 passes through the groove h in a state in which the absorbent material 21 is in contact with the surface of the transfer substrate 200, or the micro-semiconductor chip 110 may be turned over so that the first end 115 faces upward as shown in FIG. 24 while the absorbent material 21 presses the micro-semiconductor chip 110.

A scanning process by the absorbent material 21 may be repeated. When the liquid L is absorbed in the scanning process by the absorbent material 21 and the liquid L is insufficient, the supply of the liquid L by the chip supply module 330 may also be repeatedly performed. During this operation, height increase and decrease of the liquid L present on the transfer substrate 200 may be repeatedly performed.

The pressure applied by the absorbent material 21 to the transfer substrate 200 and the micro-semiconductor chip 110 may be determined in consideration of a material of the absorbent material 21, moving speed of the absorbent material 21, strength of the transfer substrate 200, and a support state of the transfer substrate 200. By determining the pressure at which the absorbent material 21 presses the transfer substrate 200 in consideration of the material of the absorbent material 21, the moving speed of the absorbent material 21, the strength of the transfer substrate 200, and the support state of the transfer substrate 200, a phenomenon in which the micro-semiconductor chip 110 is damaged, the transfer substrate 200 is damaged, or the transfer substrate 200 is shaken by the absorbent material 21 may be prevented.

Figure 26:
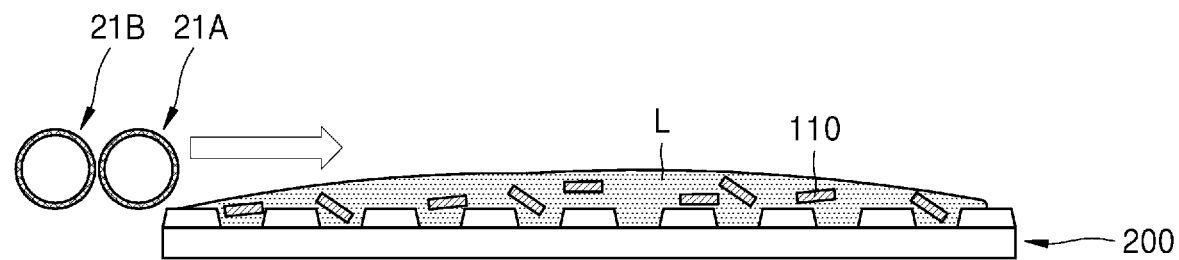
FIG. 26 is a view for explaining an example in which a chip alignment module according to an example embodiment has a plurality of absorbent materials.

The absorbent material 21 may be singular, but is not limited thereto, and as shown in FIG. 26, a plurality of absorbent materials 21A and 21B may be provided.

Figure 27:
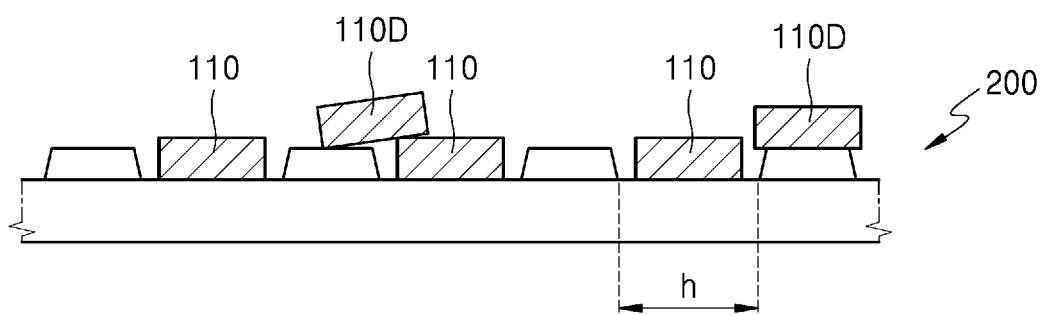
FIG. 27 is a view for explaining a state in which a dummy micro-semiconductor chip is present on a transfer substrate.

According to the process of scanning the transfer substrate 200 by the absorbent material 21, as shown in FIG. 27, the plurality of micro-semiconductor chips 110 are inserted and aligned in the groove h of the transfer substrate 200. In this case, some micro-semiconductor chips 110 may be located on the surface of the transfer substrate 200 without being inserted into the groove h. The micro-semiconductor chip 110 may be referred to as a dummy micro-semiconductor chip 110D. The liquid L may hardly remain on the transfer substrate 200 due to evaporation or absorption. In this case, the fluidity of the dummy micro-semiconductor chip 110D may be deteriorated.

The cleaning module 30 may be configured to remove the dummy micro-semiconductor chip 110D remaining on the surface of the transfer substrate 200 after alignment of the plurality of micro-semiconductor chips 110 in the plurality of grooves h by the chip alignment module 20 is completed. The cleaning module 30 may remove the dummy micro-semiconductor chip 110D by various methods.

Figure 28:
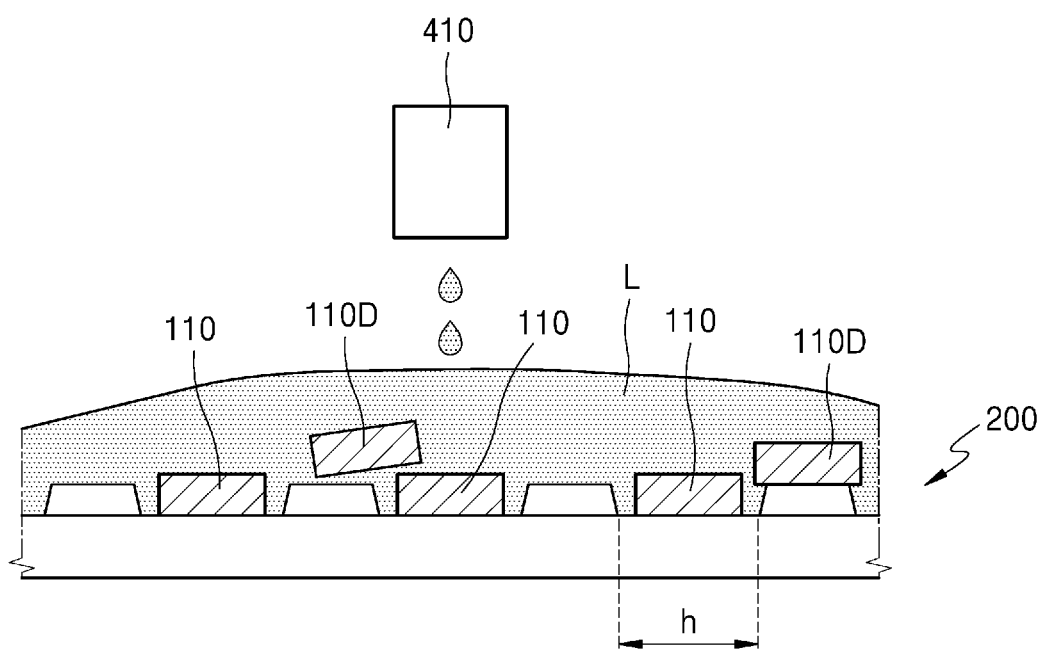
FIGS. 28 and 29 are views for explaining an operation of a cleaning module according to an example embodiment.
Figure 29:
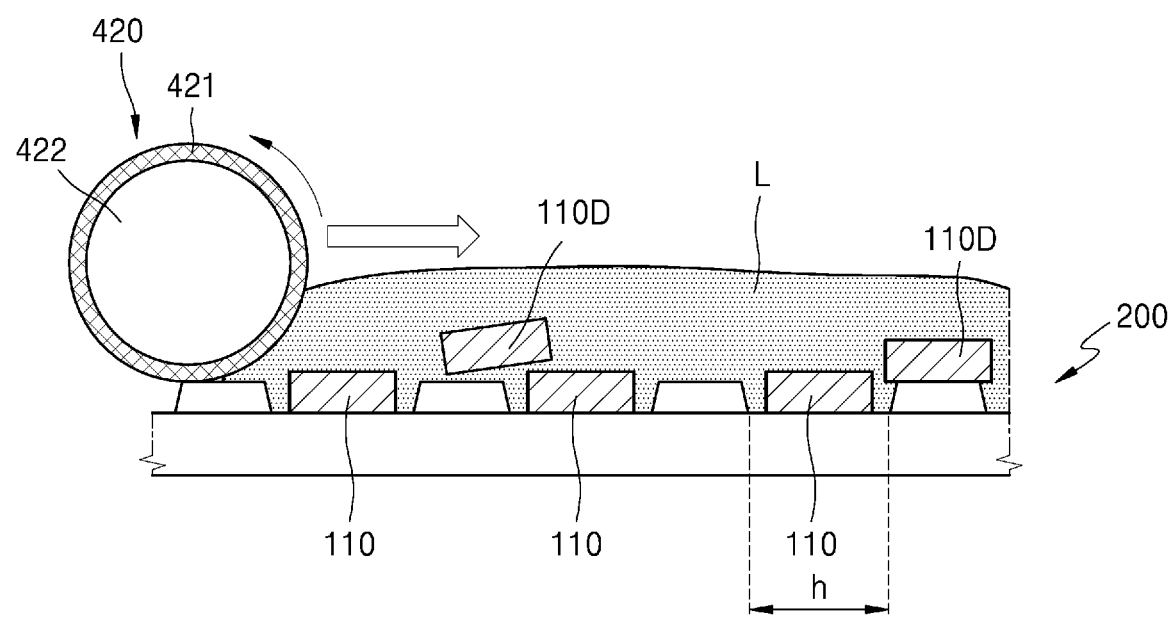

For example, referring to FIGS. 28 and 29, the cleaning module 30 may include a second liquid supply module 410 and a pressurization module 420.

The second liquid supply module 410 may supply the liquid L on the transfer substrate 200 to increase the fluidity of the dummy micro-semiconductor chip 110D.

The liquid L may be any type of liquid as long as it does not corrode or damage the micro-semiconductor chip 110. The liquid L may be the same as the liquid L supplied by the chip supply module 330, but is not limited thereto, and may be different.

The liquid L may include, for example, at least one of water, ethanol, alcohol, polyol, ketone, halocarbon, acetone, a flux, or an organic solvent. The organic solvent may include, for example, IPA. The liquid L is not limited thereto, and various changes are possible.

In a state in which the liquid L is supplied, the pressurization module 420 may move while contacting and pressing the surface of the transfer substrate 200.

The pressure applied to the transfer substrate 200 by the pressure module 420 may be greater than the pressure applied to the transfer substrate 200 by the absorbent material 21 of the chip alignment module 20. Through this, the dummy micro-semiconductor chip 110D attached to the surface of the transfer substrate 200 may be easily separated in the scanning operation by the chip alignment module 20.

Figure 30:
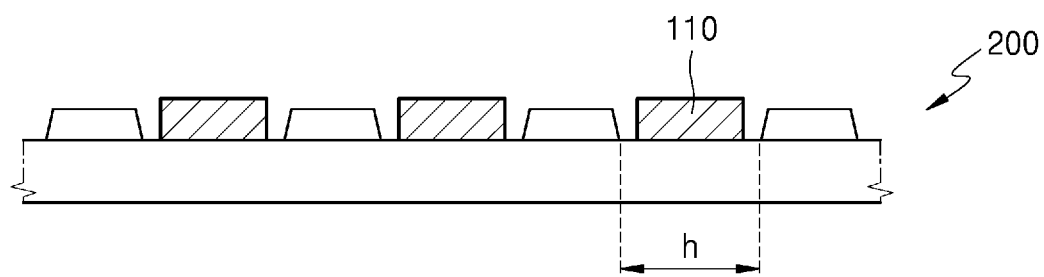
FIG. 30 is a view for explaining a transfer substrate in a state in which a cleaning operation is completed.

The dummy micro-semiconductor chip 110D may be separated from the surface of the transfer substrate 200 by the pressurization module 420 and may be transferred to the outside of the transfer substrate 200. Accordingly, as shown in FIG. 30, the transfer substrate 200 may be in a state in which the plurality of micro-semiconductor chips 110 are aligned in the plurality of grooves h, and the dummy micro-semiconductor chip 110D is removed.

The pressurization module 420 may be a member capable of pressing enough not to damage the dummy micro-semiconductor chip 110D.

For example, the pressurization module 420 may include an absorbent material 421 that absorbs the liquid L. The absorbent material 421 may include, for example, fabric, tissue, polyester fiber, paper, or a wiper. The absorbent material 421 may be used alone without other auxiliary devices. The pressurization module 420 may include a support 422 supporting the absorbent material 421. For example, the support 422 may include a rod, a blade, a plate, or a wiper. The absorbent material 421 may be provided on either side of the support 422, or may have a shape wound around the support 422.

Figure 31:
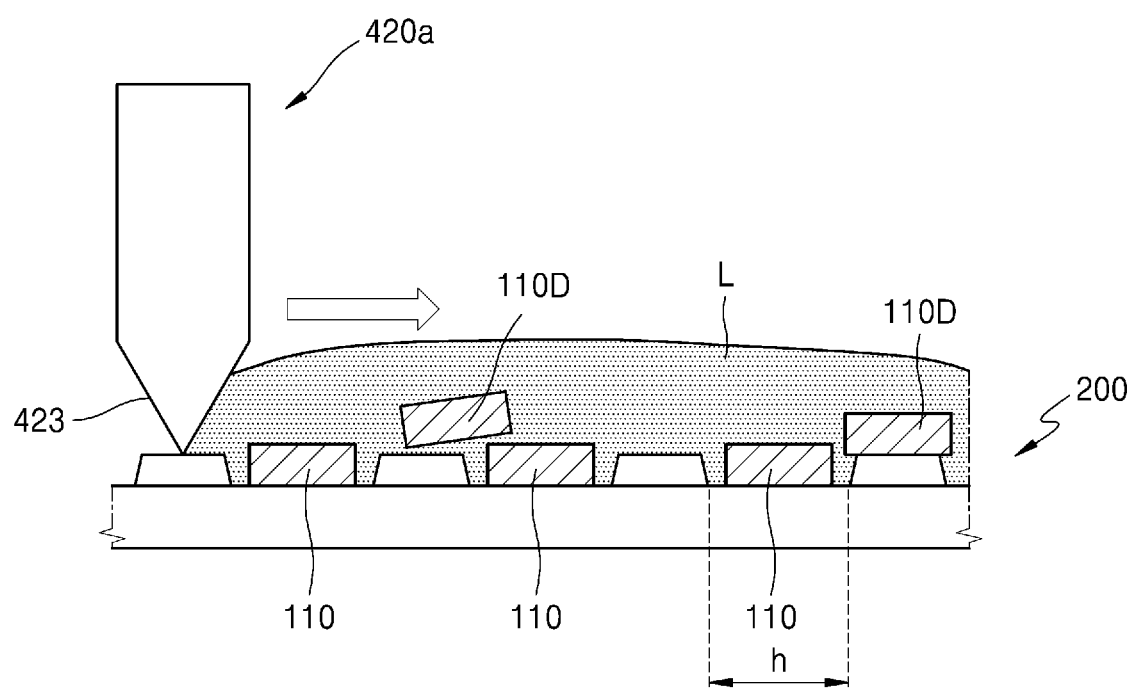
FIG. 31 is a view for explaining a pressing member of a cleaning module according to another example embodiment.

As another example, as shown in FIG. 31, a pressurization module 420a may include an elastic member 423 that is elastically deformable instead of the absorbent material 421. For example, the elastic member 423 may include a silicone material.

Referring back to FIG. 29, in the pressure module 420, the dummy micro-semiconductor chip 110D may be attached to a surface of the absorbent material 421 during a cleaning process. In consideration of this point, the pressurization module 420 may have a rotatable structure. For example, the absorbent material 421 may rotate about a rotation axis. By rotating the absorbent material 421 at a certain cycle or under a certain condition, the surface of the absorbent material 421 to which the dummy micro-semiconductor chip 110D is adhered may be turned back, and a clean surface to which the dummy micro-semiconductor chip 110D is not attached may be located at a front end in a moving direction of the pressurization module 420. Accordingly, contamination of the surface of the transfer substrate 200 by the pressurization module 420 may be prevented.

However, the configuration of the cleaning module 30 is not limited thereto, and may be variously modified.

Figure 32:
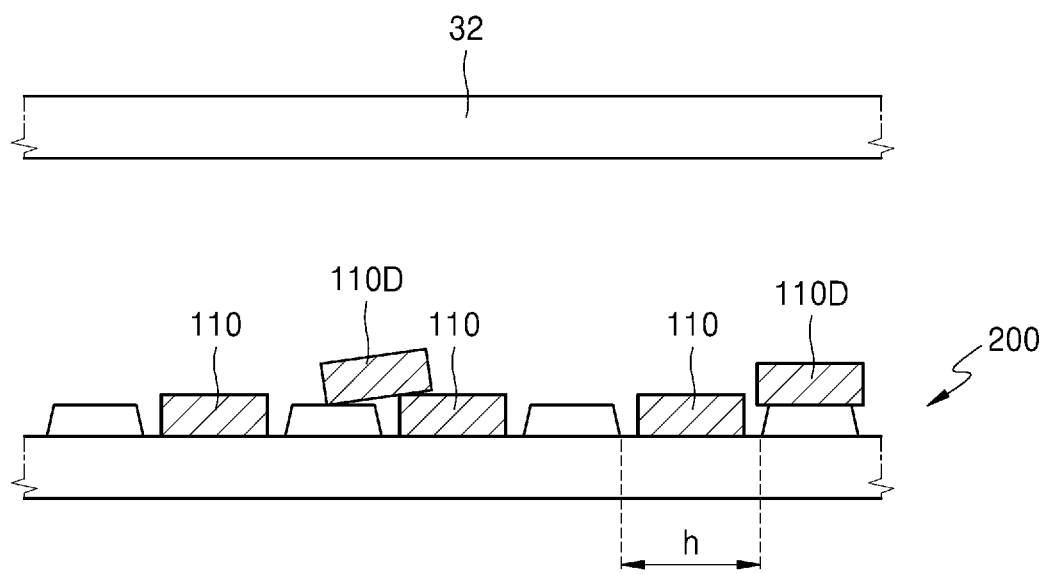
FIGS. 32 and 33 are views for explaining an example of a cleaning module according to another example embodiment.
Figure 33:
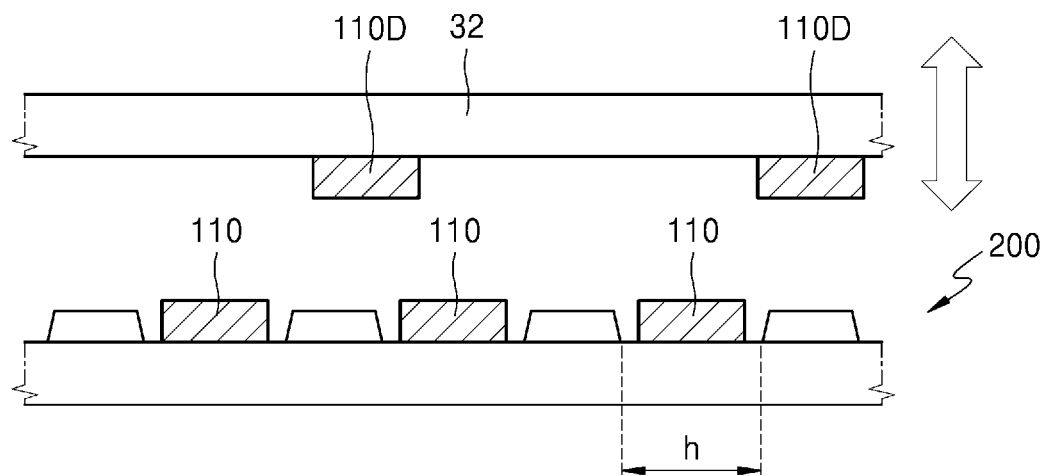

For example, referring to FIGS. 32 and 33, the cleaning module 30 may include an adhesive member 32. The cleaning module 30 may be configured such that the adhesive member 32 approaches and moves apart from the transfer substrate 200. The adhesive member 32 may approach a height at which only the dummy micro-semiconductor chip 110D contacts without contacting the surface of the transfer substrate 200. In this process, only the dummy micro-semiconductor chip 110D may be selectively adhered to the adhesive member 32. Accordingly, only the dummy micro-semiconductor chip 110D may be selectively removed from the transfer substrate 200.

Figure 34:
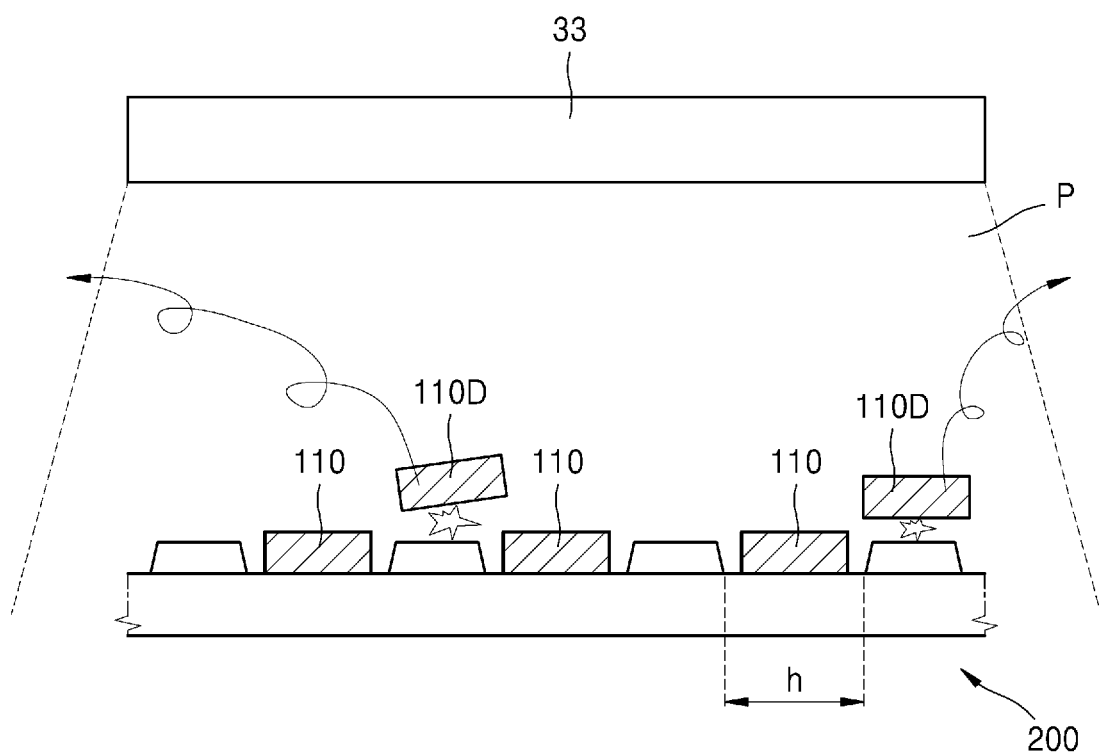
FIG. 34 is a view for explaining an example of a cleaning module according to another example embodiment.

As another example, referring to FIG. 34, the cleaning module 30 may include a light irradiator 33 for irradiating pulsed light P on the transfer substrate 200. The light irradiator 510 may be a pulse lamp. For example, the light irradiator 510 may be a Xenon lamp. As the liquid L or foreign substances expand between the surface of the transfer substrate 200 and the dummy micro-semiconductor chip 110D by the pulsed light P provided to the transfer substrate 200, the dummy micro-semiconductor chip 110D may be separated from the surface of the transfer substrate 200.

Figure 35:
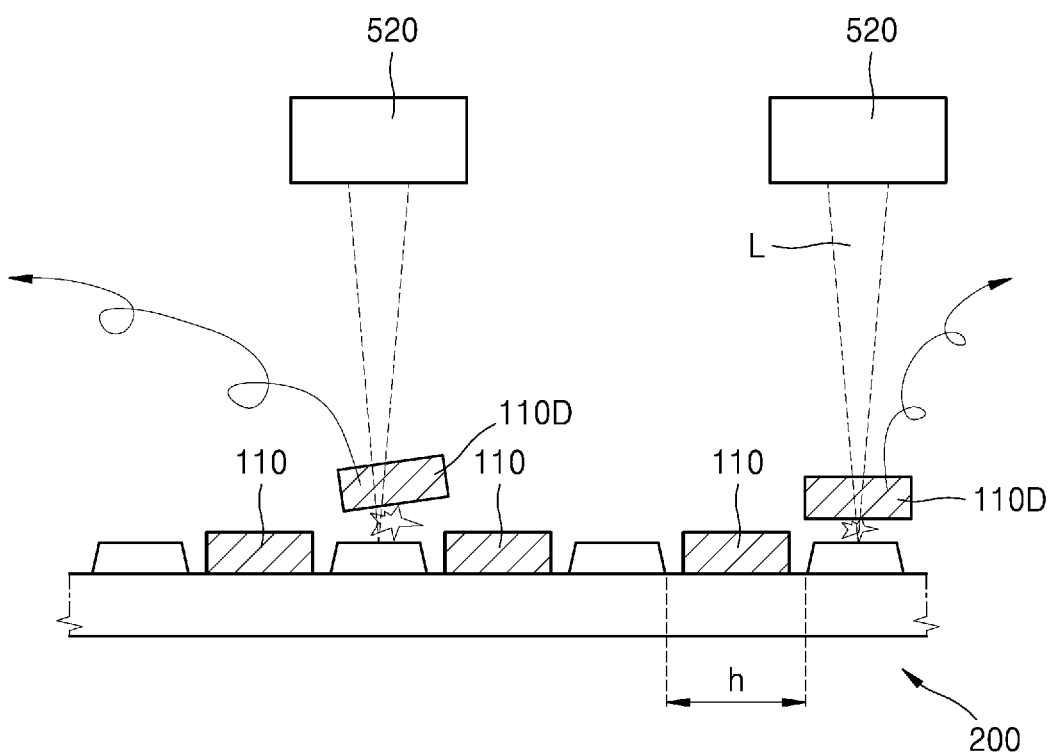
FIG. 35 is a view for explaining an example of a cleaning module according to another example embodiment.

As another example, referring to FIG. 35, the cleaning module 30 may include a laser irradiator 520 for locally irradiating a laser beam L on the transfer substrate 200. The laser irradiator 520 may locally irradiate the laser beam L between the dummy micro-semiconductor chip 110D and the surface of the transfer substrate 200. The laser irradiator 520 may selectively focus the laser beam L on a lower area of the dummy micro-semiconductor chip 110D to separate the dummy micro-semiconductor chip 110D from the surface of the transfer substrate 200.

Figure 36:
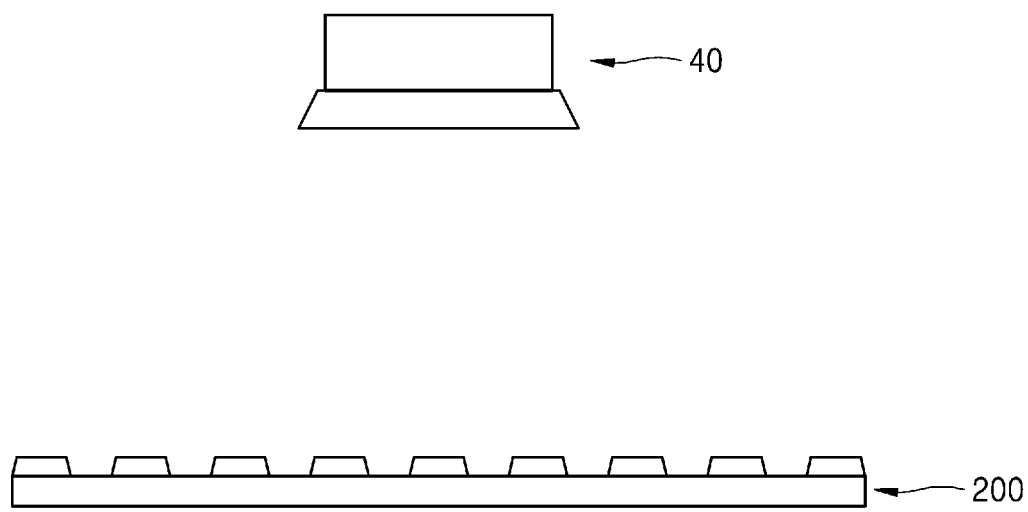
FIGS. 36 and 37 are views for explaining an operation of an inspection module according to an example embodiment.

Referring to FIGS. 18 and 36, the chip transfer apparatus 1 according to the example embodiment may further include the inspection module 40 for inspecting a state of the transfer substrate 200. The inspection module 40 may be a camera capable of high-resolution image analysis. The inspection module 40 may inspect the state of the transfer substrate 200 through image analysis.

For example, the inspection module 40 may inspect an alignment state of the micro-semiconductor chip 110 on the transfer substrate 200. Based on a result of the inspection by the inspection module 40, the controller 70 may control at least one of the chip transfer module 10 and the chip alignment module 20 to operate. Through this, the alignment accuracy of the plurality of micro-semiconductor chips 110 may be improved.

Figure 37:
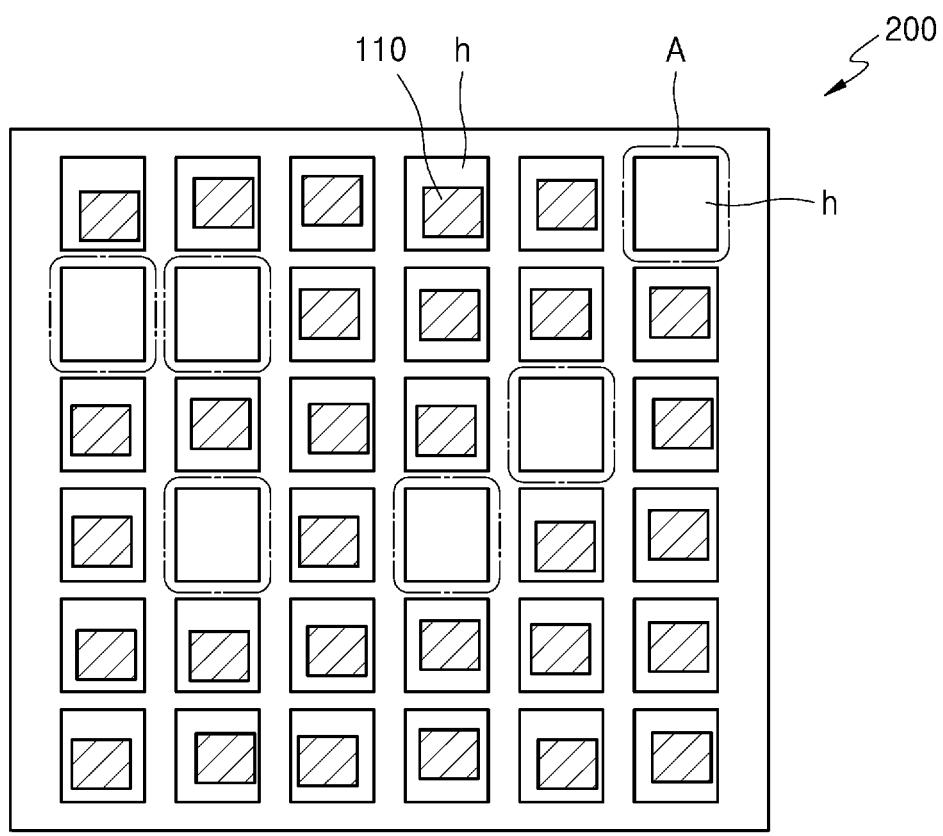

For example, the inspection result by the inspection module 40, as shown in FIG. 37, a position A of the groove h in which the micro-semiconductor chip 110 is not aligned from among the plurality of grooves h of the transfer substrate 200 may be identified. In this case, based on the inspection result by the inspection module 40, the controller 70 may control at least one of the chip transfer module 10 and the chip alignment module 20 to operate based on the identified position A of the groove h.

As another example, the inspection module 40 may inspect a supply state of the plurality of micro-semiconductor chips 110 and the liquid L on the transfer substrate 200.

For example, the inspection module 40 may inspect whether the liquid L is present on the transfer substrate 200 or whether the liquid L is sufficient even if the liquid L is present. Based on the inspection result by the inspection module 40, the controller 70 may control the chip supply module 330 to operate.

For example, the inspection module 40 may inspect whether the plurality of micro-semiconductor chips 110 exist on the transfer substrate 200 or whether the plurality of micro-semiconductor chips 110 are sufficient even if the plurality of micro-semiconductor chips 110 exist. Based on the inspection result by the inspection module 40, the controller 70 may control the chip supply module 330 to operate.

As such, by controlling at least one of the chip transfer module 10 and the chip alignment module 20 to operate based on the inspection result by the inspection module 40, the control unit 70 may improve the alignment accuracy of the plurality of micro-semiconductor chips 110.

Figure 38:
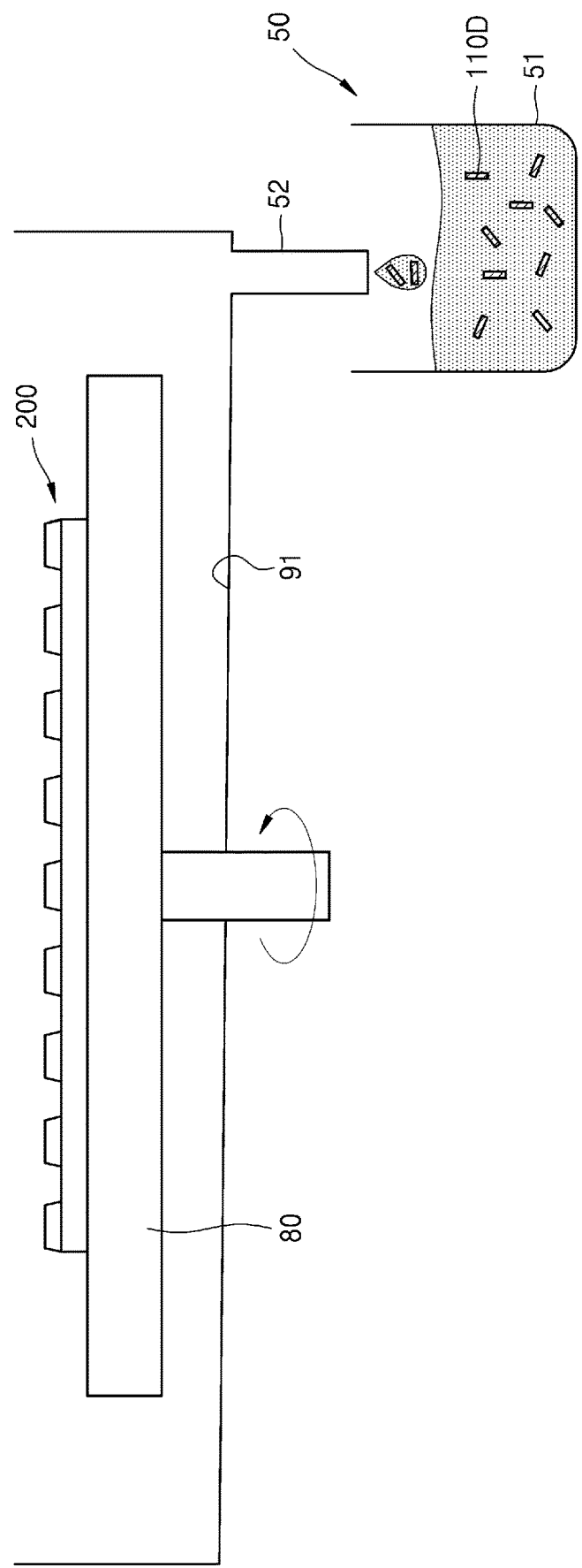
FIG. 38 is a view for explaining a configuration for supporting a transfer substrate and a peripheral member thereof in a semiconductor chip transfer apparatus.

FIG. 38 is a view for explaining a configuration for supporting the transfer substrate 200 and a peripheral member thereof in a chip transfer apparatus. Referring to FIG. 38, the chip transfer apparatus 1 according to an example embodiment may include a substrate support 80 and a recovery module 50.

The substrate support 80 may support the transfer substrate 200. The substrate support 80 supports the transfer substrate 200 so that the transfer substrate 200 does not move unintentionally during relative movement of the absorbent material 21 and the transfer substrate 200. The substrate support 80 may adsorb and support a lower surface of the transfer substrate 200. The substrate support 80 may be rotatable. However, the support structure and operation of the substrate support 80 is not limited thereto, and may be variously modified.

The recovery module 50 may recover the dummy micro-semiconductor chip 110D. The recovery module 50 may include an accommodating unit S1 accommodating the dummy micro-semiconductor chip 110D separated from the transfer substrate 200. The dummy micro-semiconductor chip 110D accommodated in the accommodating unit S1 may be recycled. The recovery module 50 may have a structure in which a fluid flows toward the accommodating unit S1 on a bottom surface 91 so that the micro-semiconductor chip 110 is transferred toward the accommodating unit 51. The bottom surface 91 may have a shape inclined downward toward a drain port 52.

Figure 39:
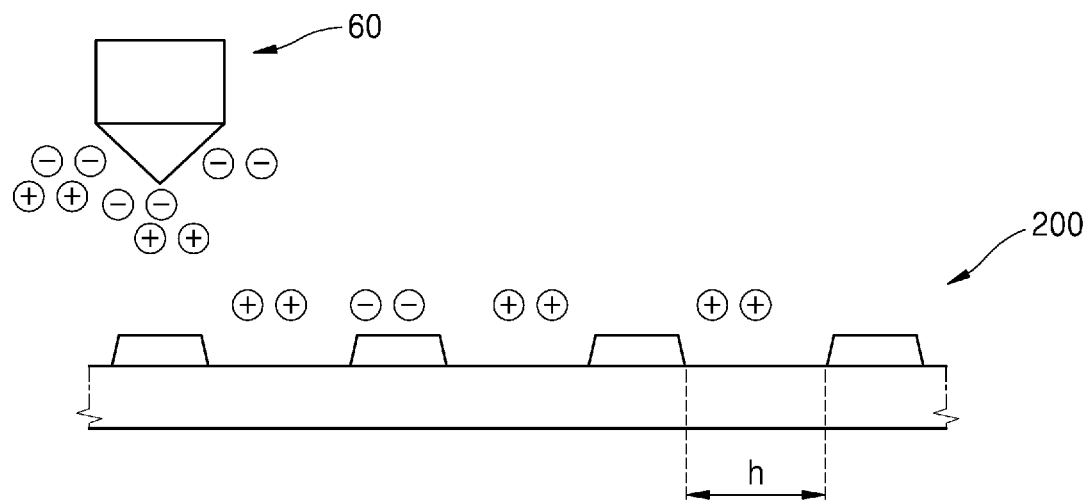
Figure 40:
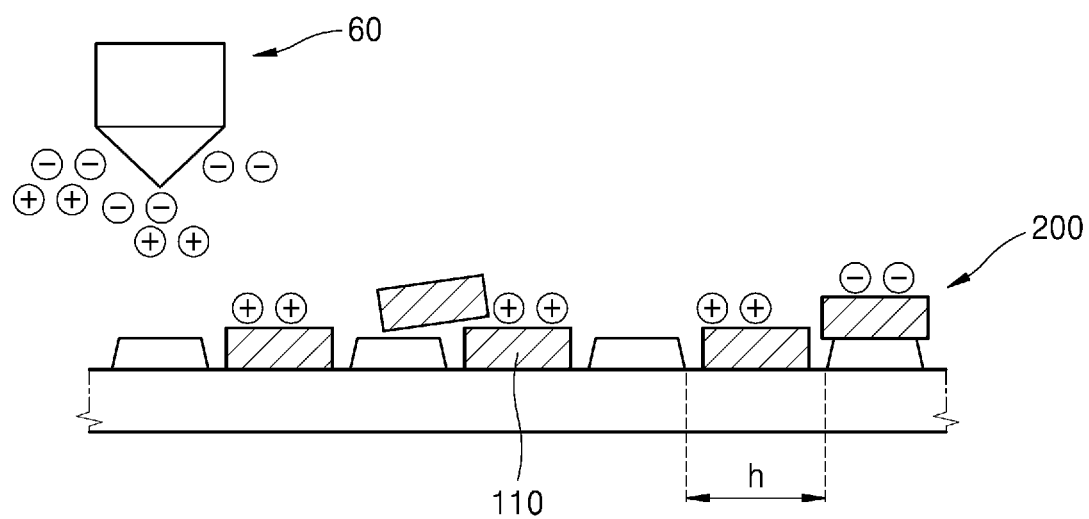

Referring to FIGS. 1, 39, and 40, the chip transfer apparatus 1 according to an example embodiment may further include the antistatic module 60 that supplies ions onto the transfer substrate 200 to remove static electricity on the transfer substrate 200.

The plurality of micro-semiconductor chips 110 are very small, and accordingly, even a small amount of static electricity may cause damage or unintentional movement. In consideration of this point, the antistatic module 60 may supply ions for preventing static electricity to the transfer substrate 200 or the plurality of micro-semiconductor chips 110.

For example, referring to FIG. 39, the antistatic module 60 may supply ions for preventing static electricity to the transfer substrate 200 before the plurality of micro-semiconductor chips 110 are supplied onto the transfer substrate 200. As another example, referring to FIG. 40, the antistatic module 60 may supply ions for preventing static electricity after the plurality of micro-semiconductor chips 110 are supplied onto the transfer substrate 200 and alignment of the plurality of micro-semiconductor chips 110 is progressed to some extent.

An electronic device may be manufactured using the wet-transferred micro-semiconductor chip 110. When the micro-semiconductor chip 110 is a light-emitting diode, a display device may be manufactured using the wet-transferred micro-semiconductor chip 110.

A chip transfer apparatus according to an example embodiment may efficiently align micro-semiconductor chips on a large area by a wet method. Because the micro-semiconductor chip may be quickly transferred to a large area, the micro-semiconductor chip may be applied to a large display device, and the cost of transferring the micro-semiconductor chip to a large area may be lowered to lower the unit cost of a display device.

It should be understood that example embodiments described herein should be considered in a descriptive sense only and not for purposes of limitation. Descriptions of features or aspects within each example embodiment should typically be considered as available for other similar features or aspects in other example embodiments. While one or more example embodiments have been described with reference to the figures, it will be understood by those of ordinary skill in the art that various changes in form and details may be made therein without departing from the spirit and scope as defined by the following claims.

What is claimed is:

1. A chip transfer apparatus configured to align a plurality of micro-semiconductor chips in a plurality of grooves of a transfer substrate, the chip transfer apparatus comprising:
    a chip storage module configured to store a suspension including the plurality of micro-semiconductor chips and impurities;
    a chip filtration module configured to receive the suspension from the chip storage module and separate a first suspension including the plurality of micro-semiconductor chips and a second suspension including the impurities; and
    a chip supply module configured to supply the first suspension onto the transfer substrate from the chip filtration module, wherein the plurality of micro-semiconductor chips included in the first suspension are flowable on the transfer substrate,
    wherein the chip filtration module comprises:
        an inlet connected to a lower area of the chip storage module, the inlet configured to receive the suspension introduced from the chip storage module;
        a channel connected to the inlet and through which the suspension flows; and
        a first outlet connected to the channel and an upper area of the chip supply module and configured to discharge the first suspension to the chip supply module.

2. The chip transfer apparatus of claim 1, wherein the chip filtration module is further configured to separate the suspension into the first suspension and the second suspension using at least one of sonophoretic dynamics, dielectrophoresis, magnetophoretic dynamics, microfluidic dynamics, centrifugal force, or pinched flow fractionation.

3. The chip transfer apparatus of claim 1, wherein at least one of a size and a mass of the impurities is different from a size or a mass of the micro-semiconductor chips included in the first suspension.

4. The chip transfer apparatus of claim 1, wherein the impurities comprise a micro-semiconductor chip debris having at least one of a size and a mass different from a size or a mass of the micro-semiconductor chips included in the first suspension.

5. The chip transfer apparatus of claim 4, wherein a micro-semiconductor chip debris included in the second suspension is smaller than the micro-semiconductor chips included in the first suspension.

6. The chip transfer apparatus of claim 4, wherein the micro-semiconductor chip debris included in the second suspension is a partially broken micro-semiconductor chip.

7. The chip transfer apparatus of claim 1, wherein the chip filtration module is formed of a substrate including at least one of silicon, glass, polymer, plastic, or metal, and wherein the channel is embedded in the substrate.

8. The chip transfer apparatus of claim 1, wherein an anti-adhesive film is formed on a surface of the channel, the anti-adhesive film configured to prevent adherence of the micro-semiconductor chips.

9. The chip transfer apparatus of claim 8, wherein the anti-adhesive film is hydrophobic.

10. The chip transfer apparatus of claim 1, further comprising:
    a second outlet connected to the channel and configured to discharge the second suspension.

11. The chip transfer apparatus of claim 10, wherein the channel comprises:
    a branching area in which the micro-semiconductor chips and the impurities are separated;
    a first channel through which the suspension flows, the first channel connecting the inlet to the branching area;
    a second channel through which the first suspension flows, the second channel connecting the branching area to the first outlet; and
    a third channel through which the second suspension flows, the third channel connecting the branching area to the second outlet.

12. The chip transfer apparatus of claim 11, wherein a dimension of the third channel is smaller than a dimension of the second channel.

13. The chip transfer apparatus of claim 11, wherein the third channel comprises a first sub-channel and a second sub-channel spaced apart the first sub-channel, and
    wherein the second channel is provided between the first sub-channel and the second sub-channel.

14. The chip transfer apparatus of claim 13, wherein the first sub-channel and the second sub-channel have a symmetrical structure with respect to the second channel.

15. The chip transfer apparatus of claim 1, wherein the chip filtration module further comprises:
    a second outlet connected to the channel and configured to discharge a first sub-suspension including impurities smaller than the micro-semiconductor chips in the second suspension; and
    a third outlet connected to the channel and configured to discharge a second sub-suspension including impurities larger than the micro-semiconductor chips in the second suspension.

16. The chip transfer apparatus of claim 15, wherein the channel comprises:
    a first branching area and a second branching area spaced apart from the first branching area;
    a first channel through which the suspension flows, the first channel connecting the inlet to the first branching area;
    a second channel through which the first suspension and the second sub-suspension flow, the second channel connecting the first branching area to the first branching area;
    a third channel through which the first sub-suspension flows, the third channel connecting the first branching area to the second outlet;
    a fourth channel through which the first suspension flows, the fourth channel connecting the second branching area to the first outlet; and
    a fifth channel through which the second sub-suspension flows, the fifth channel connecting the second branching area to the third outlet.

17. The chip transfer apparatus of claim 16, wherein the first channel, the second channel, and the fifth channel have a same length direction.

18. The chip transfer apparatus of claim 1, wherein the chip storage module comprises:
    a stirrer configured to mix the suspension to make a concentration of the micro-semiconductor chips uniform.

19. The chip transfer apparatus of claim 1, wherein the micro-semiconductor chips are light-emitting devices.

20. The chip transfer apparatus of claim 19, wherein the light-emitting devices each comprise first and second electrodes apart from each other on one surface.

21. A chip filtration apparatus comprising:
    an inlet configured to receive a first suspension including a plurality of micro-semiconductor chips and a plurality of impurities;
    a first channel configured to transport the first suspension from the inlet to a junction at which the first suspension is separated into a second suspension including the plurality of micro-semiconductor chips and a third suspension including the plurality of impurities;
    a second channel connected to the junction and configured to transport the second suspension including the plurality of micro-semiconductor chips;
    a third channel connected to the junction and configured to transport the third suspension including the plurality of impurities;
    a first outlet connected to the second channel and configured to receive the second suspension including the plurality of micro-semiconductor chips; and
    a second outlet connected to the third channel and configured to receive the third suspension including the plurality of impurities.

22. The chip filtration apparatus of claim 21, wherein the inlet is connected to a lower area of a chip storage module.

23. The chip filtration apparatus of claim 21, wherein the first outlet is connected to an upper area of a chip supply module and configured to discharge the second suspension to the chip supply module.

24. The chip filtration apparatus of claim 21, wherein the first suspension is separated into the second suspension and the third suspension using at least one of sonophoretic dynamics, dielectrophoresis, magnetophoretic dynamics, microfluidic dynamics, centrifugal force, or pinched flow fractionation.

* * * * *